United States Patent [19]
Takeuchi

[11] Patent Number: 6,023,023
[45] Date of Patent: Feb. 8, 2000

[54] NOISE ABSORBING APPARATUS

[75] Inventor: Yasuichi Takeuchi, Tokyo, Japan

[73] Assignee: Takeuchi Industrial Co., Ltd., Tokyo, Japan

[21] Appl. No.: 08/885,388

[22] Filed: Jun. 30, 1997

[30] Foreign Application Priority Data

| Jul. 19, 1996 | [JP] | Japan | 8-191071 |
| Nov. 29, 1996 | [JP] | Japan | 8-319529 |
| Mar. 17, 1997 | [JP] | Japan | 9-062562 |
| Mar. 17, 1997 | [JP] | Japan | 9-062564 |

[51] Int. Cl.$^7$ ................................. H01F 17/06
[52] U.S. Cl. ................................. 174/92; 336/92
[58] Field of Search ................... 174/92, 138 F; 333/12; 324/127; 336/65, 92, 174, 175, 176

[56] References Cited

U.S. PATENT DOCUMENTS

| 4,882,561 | 11/1989 | Fujioka | 336/65 |
| 5,291,172 | 3/1994 | Ito et al. | 336/65 |
| 5,343,184 | 8/1994 | Matsui et al. | 336/92 |
| 5,355,109 | 10/1994 | Yamazaki | 336/92 |
| 5,486,803 | 1/1996 | Igarashi et al. | 336/92 |
| 5,703,557 | 12/1997 | Osada et al. | 336/92 |

FOREIGN PATENT DOCUMENTS 63-39997  3/1988  Japan .

*Primary Examiner*—Kristine Kincaid
*Assistant Examiner*—Chau N. Nguyen
*Attorney, Agent, or Firm*—Laff, Whitesel, Conte & Saret, Ltd.

[57] ABSTRACT

A noise absorbing apparatus includes a noise absorbing unit and a fixing base. The noise absorbing unit is constituted by a pair of ferrite members and a pair of covers covering the ferrite members. The ferrite members are positioned to oppose each other to be in tight contact with each other to sandwich a cable. The fixing base is fixed on a chassis where the cable extends, and fits on the noise absorbing unit, thereby fixing the noise absorbing unit on the chassis.

4 Claims, 25 Drawing Sheets

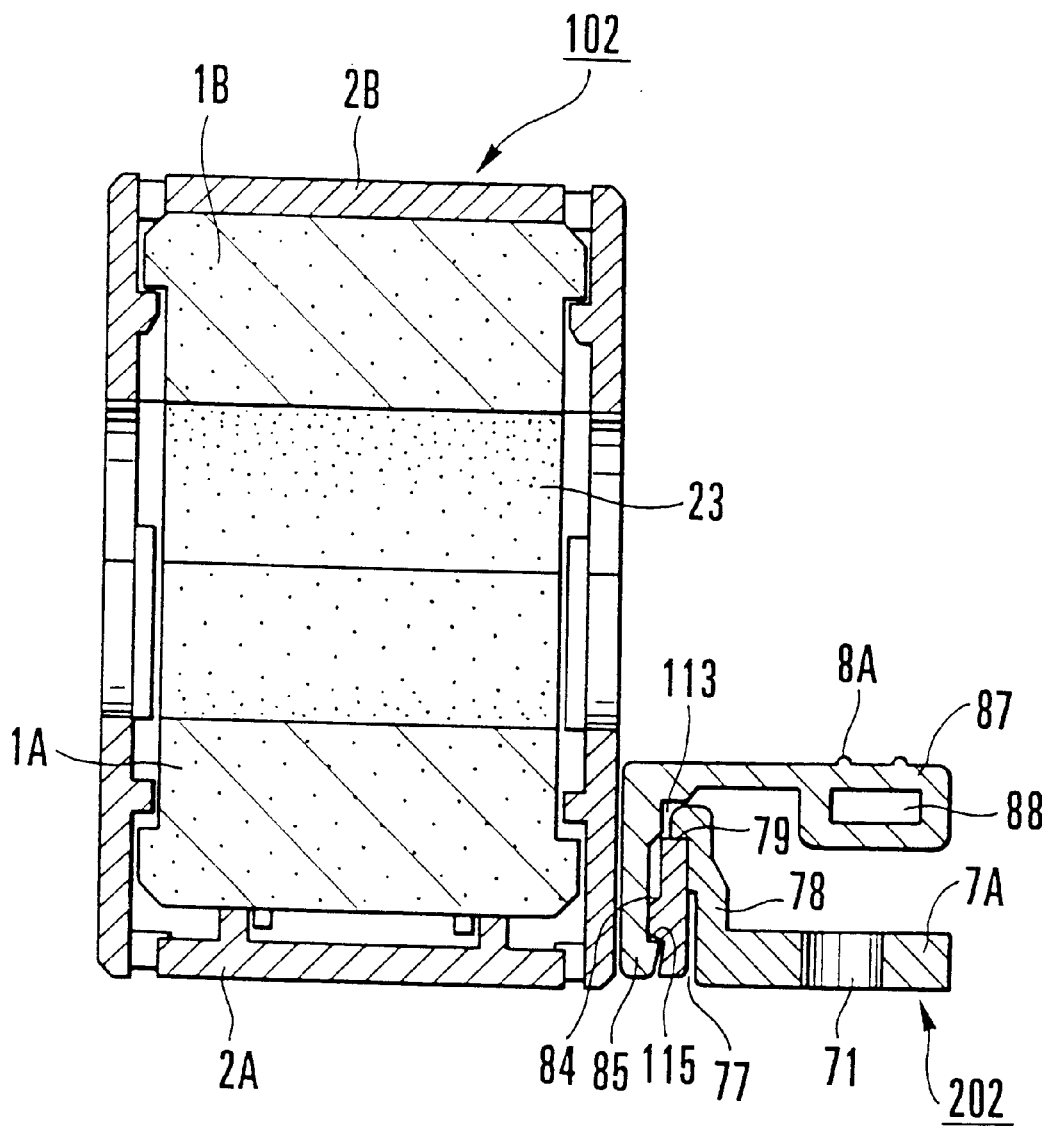
F I G. 14

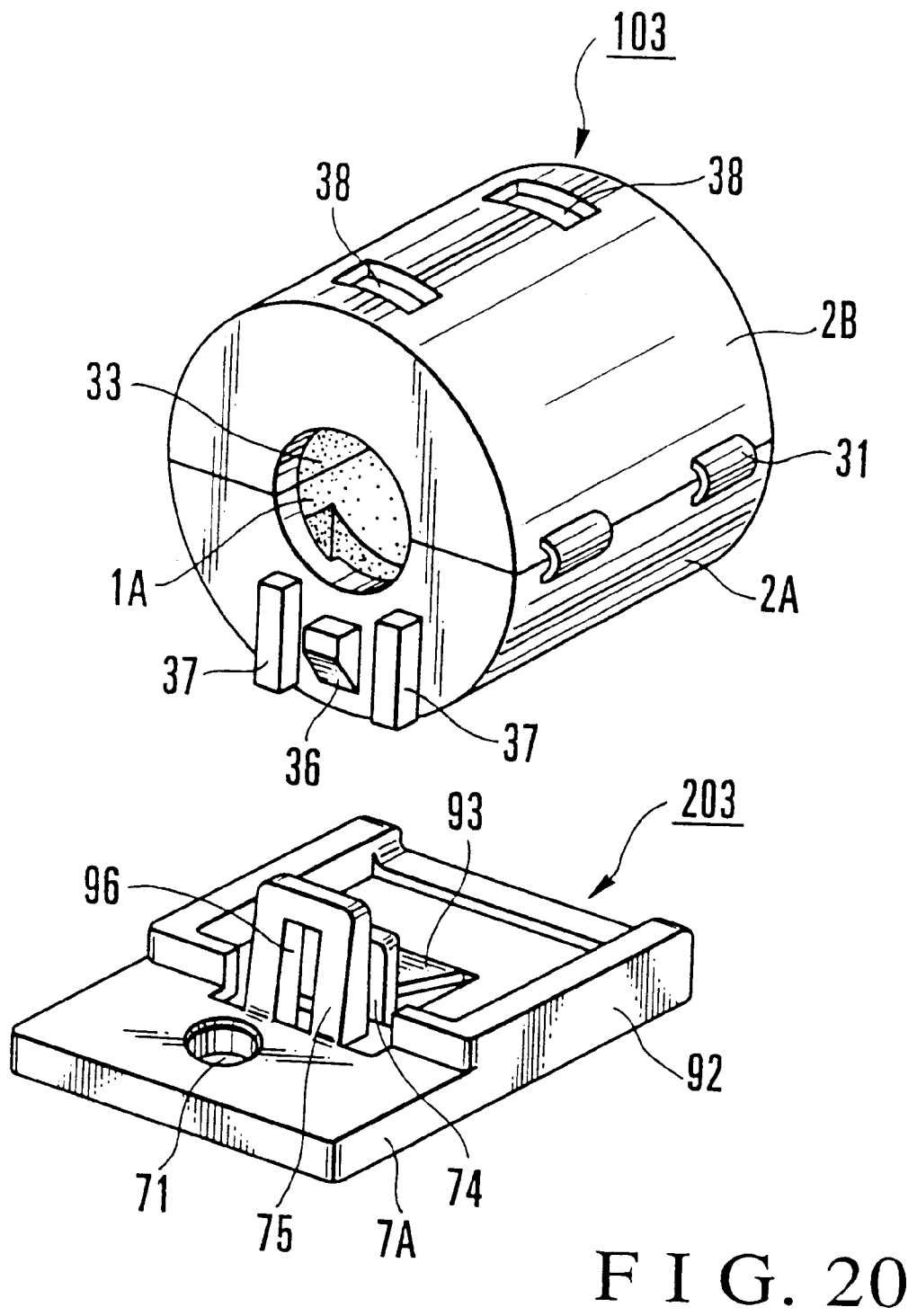
F I G. 20

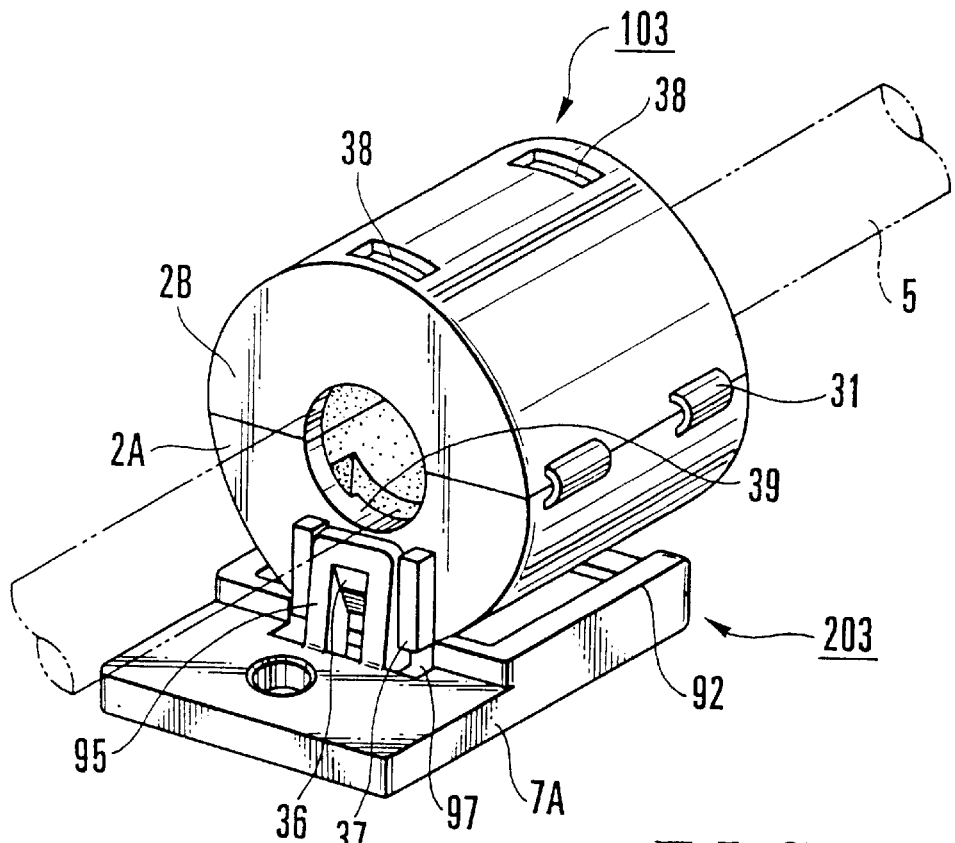
F I G. 25
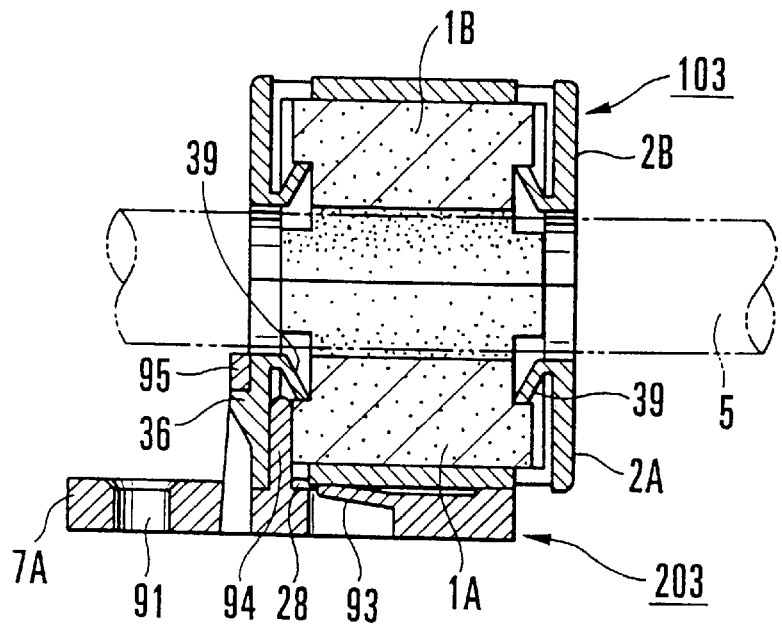
F I G. 26

NOISE ABSORBING APPARATUS

BACKGROUND OF THE INVENTION

The present invention relates to a noise absorbing apparatus for absorbing noise superposed on a signal transmitted through a cable and, more particularly, to a noise absorbing apparatus in which a closed magnetic circuit is formed to absorb noise with ferrite members so as to enclose a cable, and which can be fixed and supported on an electronic equipment, e.g., a chassis.

In an electronic equipment, e.g., a computer, that processes digital signals, when noise is superposed on a signal transmitted through a cable and enters the equipment, it causes malfunction of the equipment. For this reason, various types of noise absorbing apparatuses have recently been proposed. For example, a pair of ferrite members divided in the radial direction are brought into contact with each other to sandwich a cable between them, and the cable is enclosed with these ferrite members to constitute a closed magnetic circuit. The noise superposed on the cable is absorbed, thereby preventing noise from entering the equipment.

In order to improve the noise absorbing effect of a noise absorbing apparatus of this type, the position of the apparatus in the longitudinal direction of the cable is preferably fixed at a predetermined position. More specifically, when a noise absorbing apparatus of this type is to be put into practical use, the position of the apparatus with respect to the cable where the noise absorbing effect is most conspicuous must be obtained through experiments or the like, and the noise absorbing apparatus must then be fixed at the obtained cable position. For this purpose, conventionally, an arrangement for fixing the noise absorbing apparatus with respect to the cable is provided.

For example, in Japanese Utility Model Laid-Open No. 63-39997, projections are formed on the inner edges of cable insertion openings respectively formed in covers that support a pair of ferrite members. When the covers are closed and the ferrite members are coupled to each other, the projections clamp or bite into the outer coating of the cable to fix it. With this arrangement, however, since the projections are formed fixedly, if the diameter of the cable is small, the projections do not sometimes come into contact with or bite into the outer coating of the cable. If the cable has a large diameter and the outer coating is highly rigid, the covers cannot sometimes be closed.

In order to cope with these problems, regarding a cable arranged to extend along the chassis or panel (to be referred to as chasses hereinafter) of the electronic equipment, the noise absorbing apparatus may be fixed to these chasses, and the cable may be inserted in the noise absorbing apparatus. For this purpose, for example, a cable tie or belt insertion hole may be formed in part of the noise absorbing apparatus, a clamping belt may be inserted through this belt insertion hole, and the noise absorbing apparatus may be fixed by using this belt. Alternatively, the noise absorbing apparatus may be directly fixed to the chasses with screws or the like.

In this case, however, in order to fix the noise absorbing apparatus to the chasses, when the cable is set on the chasses, the noise absorbing apparatus must be simultaneously fixed by clamping the cable tie or belt, leading to a cumbersome fixing operation. In particular, when the noise absorbing apparatus is to be fixed at a narrow place in an electronic equipment, the fixing operation becomes very difficult. In order to simplify the fixing operation, the noise absorbing apparatus may be fixed with a double-coated tape or the like. Then, however, once the noise absorbing apparatus is fixed, it is difficult to remove the cable and the noise absorbing apparatus from the chasses for allowing maintenance of the cable.

SUMMARY OF THE INVENTION

It is an object of the present invention to provide a noise absorbing apparatus which can be easily fixed to and detached from the chasses.

In order to achieve the above object, according to the present invention, there is provided a noise absorbing apparatus comprising a noise absorbing unit constituted by a pair of ferrite members and a pair of covers covering the ferrite members, the ferrite members being positioned to oppose each other to be in tight contact with each other to sandwich a cable, and a fixing base which is fixed on a chassis where the cable extends and which fits on the noise absorbing unit, thereby fixing the noise absorbing unit on the chassis.

BRIEF DESCRIPTION OF THE DRAWINGS

FIG. 14 is a longitudinal sectional view of the assembly of FIG. 13 taken along the central position;

FIG. 20 is a perspective view of the fourth embodiment of the present invention;

FIG. 25 is a perspective view showing a state wherein the noise absorbing unit is fixed on the fixing base; and FIG. 26 is a longitudinal sectional view of FIG. 25.

DESCRIPTION OF THE PREFERRED EMBODIMENTS

Figure 3:
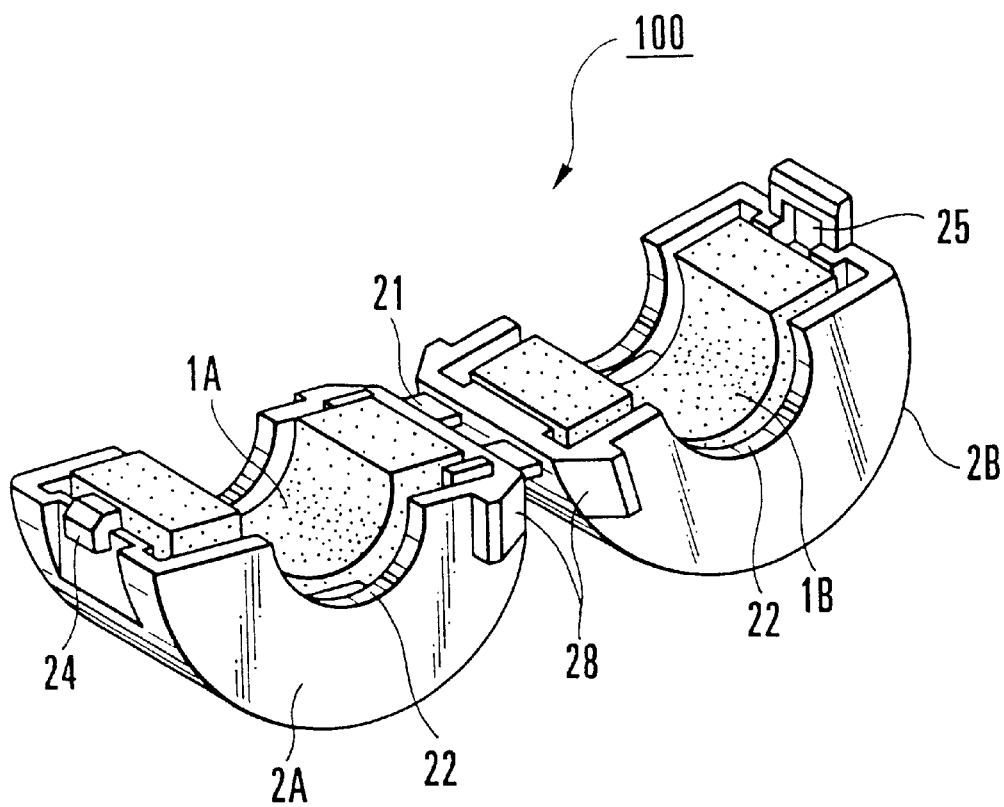
FIG. 3 is a perspective view showing the noise absorbing unit of FIG. 1 in an assembled state.

The preferred embodiments of the present invention will be described with reference to the accompanying drawings. FIG. 1 and FIGS. 2A to 2C show a noise absorbing unit 100 according to the first embodiment constituting a noise absorbing apparatus of the present invention, and FIG. 3 shows the noise absorbing apparatus in an assembled state. Referring to these drawings, reference numerals 1A and 1B denote a pair of semicylindrical ferrite members each having a small axial size; and 2A and 2B, covers forming corresponding semicylindrical containers for mounting and supporting the ferrite members 1A and 1B therein, respectively. When the ferrite members 1A and 1B are brought into contact with each other to clamp a noise absorbing cable therebetween such that their flat surfaces 11 located along their diameters oppose each other, they form a closed magnetic circuit to absorb and remove noise superposed on a signal transmitted through the cable. This noise absorbing operation is already known widely and a description thereof will be omitted. Support projections 12 are formed on the two end faces in the axial direction of each of the ferrite members 1A and 1B at positions along the circumferential surface to project in the axial direction, so that the ferrite members 1A and 1B are mounted in and supported by the covers 2A and 2B. The circumferential surface sides of the support projections 12 are tapered to facilitate mounting and fixing of the ferrite members 1A and 1B in the covers 2A and 2B, as will be described later.

The covers 2A and 2B are made of a resin while they are integrally connected to each other through a pair of living hinge connecting pieces 21 at one side portion of each cover. The covers 2A and 2B can be opened and closed due to the flexibility of the connecting pieces 21. When they are closed, the covers 2A and 2B constitute a short cylindrical container. Semicircular inner edge portions 22 of the covers 2A and 2B form opening portions 23 (see FIG. 4) on the two end faces of the cylindrical container. An arrowhead-shaped engaging projecting portion 24 projects from the other side portion of one cover 2A, among the covers 2A and 2B, in the tangential direction of the cylindrical surface of the cover 2A. An engaging hole 25 is formed in the other side portion of the other cover 2B. The engaging projecting portion 24 is inserted in and engages with the engaging hole 25.

Figure 1:
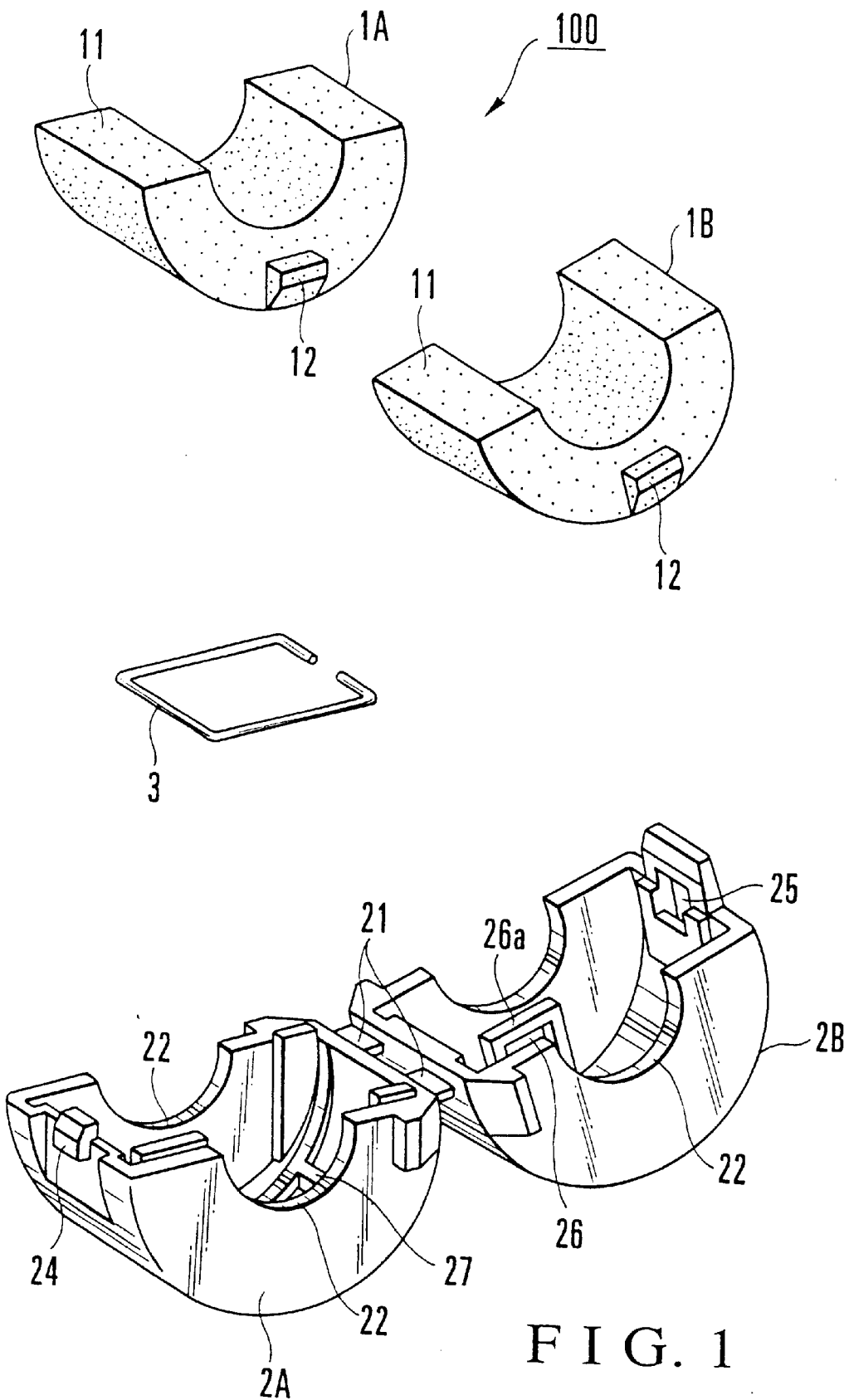
FIG. 1 is a partially exploded perspective view of a noise absorbing unit according to the first embodiment of the present invention.
Figure 2A:
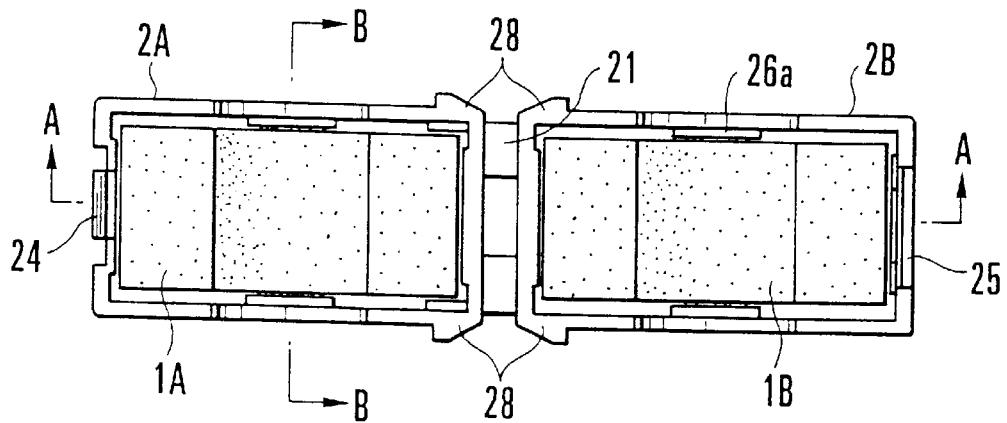
FIG. 2A is a plan view of the noise absorbing unit.
Figure 2B:
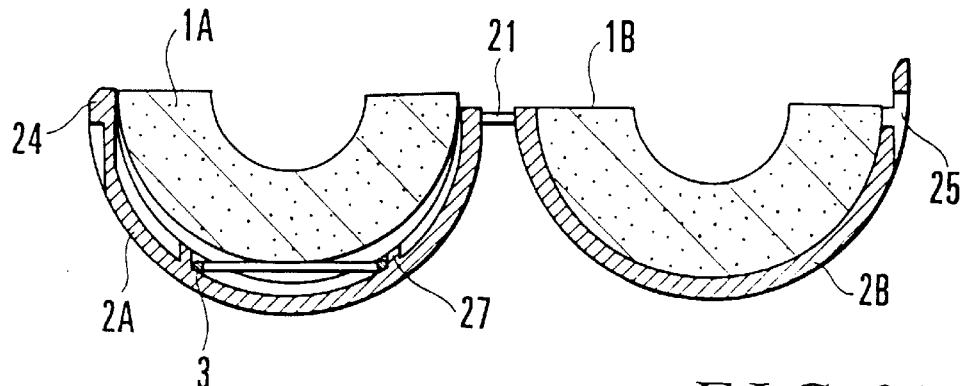
FIG. 2B is a sectional view taken along the line A—A of FIG. 2A.
Figure 2C:
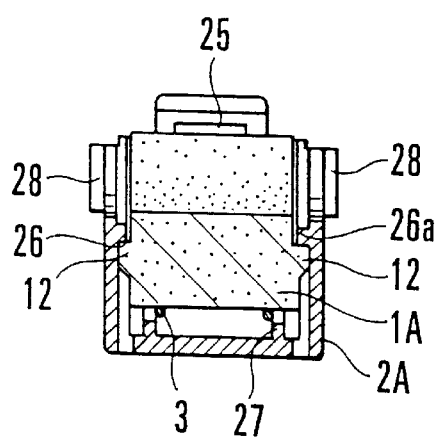
FIG. 2C is a sectional view taken along the line B—B of FIG. 2A.

A peripheral region of the inner surface of each of the two ends in the axial direction of each of the covers 2A and 2B, which extends from the circumferential surface toward the center, is formed partly thick. A fixing groove 26 is formed in each thick walled portion to extend from the outer side toward the center. The fixing groove 26 forms a stepped portion 26a in the radial direction. The fixing projections 12 formed on the two end faces of each of the ferrite members 1A and 1B can fit with the corresponding stepped portions 26a. A rectangular rib-shaped spring frame 27 is formed on the inner surface of one cover 2A, of the two covers 2A and 2B, along the circumferential edge of the cover 2A. A rectangular bent wire spring 3 can be mounted in this spring frame 27, as shown in FIG. 1.

Fitting projections 28 projecting in the axial direction are formed on the two end faces in the axial direction of each of the covers 2A and 2B at portions partly forming the circumference when the covers 2A and 2B constitute the cylindrical container described above. The fitting projections 28 form taper surfaces in which the thicknesses of their end faces gradually decrease from the central side outward in the radial direction. Therefore, the fitting projections 28 have a wedge shape as a whole.

In this structure, the ferrite members 1A and 1B are mounted in the covers 2A and 2B, respectively, as shown in FIGS. 2A to 2C and FIG. 3. Regarding this mounting, the ferrite members 1A and 1B need only be pushed into the covers 2A and 2B such that their cylindrical surfaces are pointed to the covers. Then, the support projections 12 formed on the ferrite members 1A and 1B ride over the stepped portions 26a of the fixing grooves 26 because of their taper shape, and engage with the stepped portions 26a. The ferrite members 1A and 1B are thus mounted in and supported by the covers 2A and 2B through engagement between the support projections 12 and the stepped portions 26a at the two end portions in the axial direction, so that they are prevented from coming out from the covers 2A and 2B. When supporting the ferrite members 1A and 1B, on the side of one cover 2A, before the ferrite member 1A is pushed into the cover 2A, the wire spring 3 is placed in the spring frame 27 in the cover 2A. The position of the wire spring 3 is regulated at its two sides by the spring frame 27. In this state, since the wire spring 3 is flat, its intermediate sides float from the inner surface of the cover 2A forming a cylindrical surface. When the ferrite member 1A is pushed into the cover 2A from above through wire spring 3 to be fixed in the cover 2A, the wire spring 3 flexes outward in the radial direction, and the ferrite member 1A is biased toward the flat surfaces 11 due to the elastic force obtained as the reaction force of the flexing force of the wire spring 3.

Figure 4:
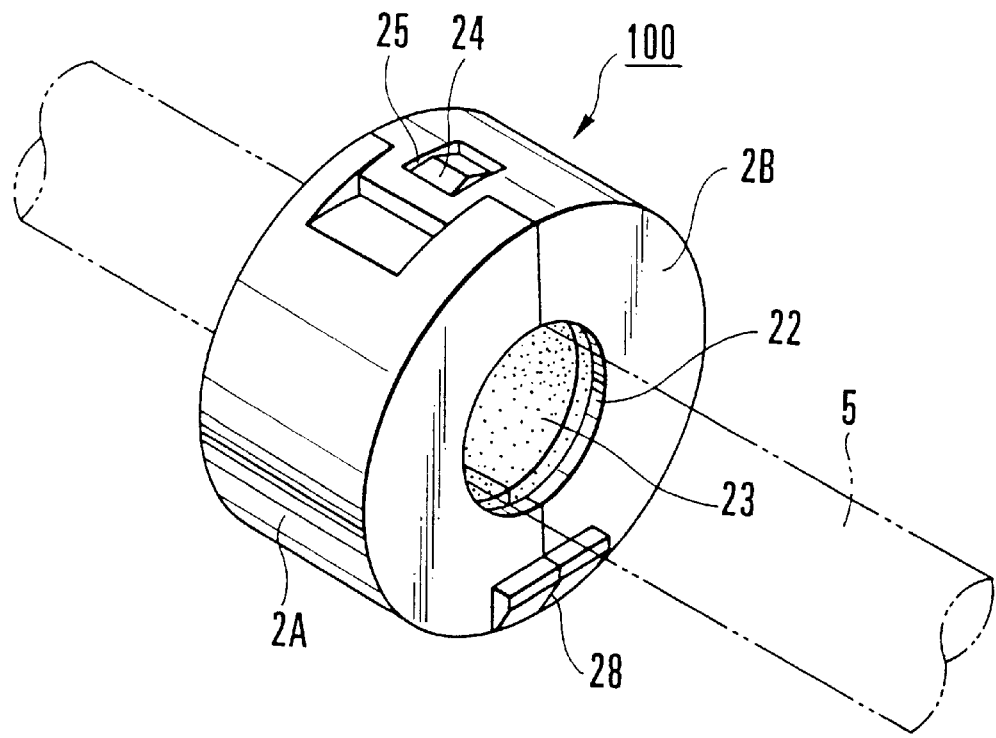
FIG. 4 is a perspective view of the noise absorbing unit and a fixing base.
Figure 4:
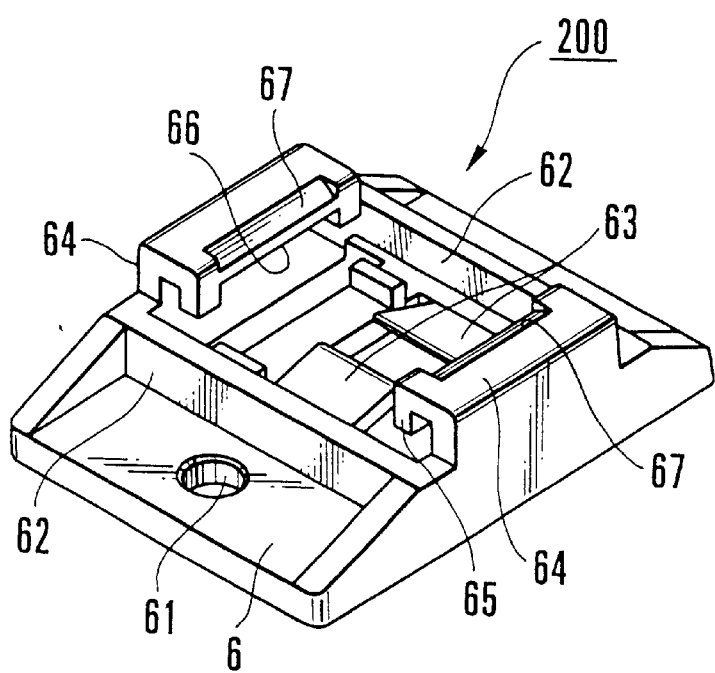
Figure 5A:
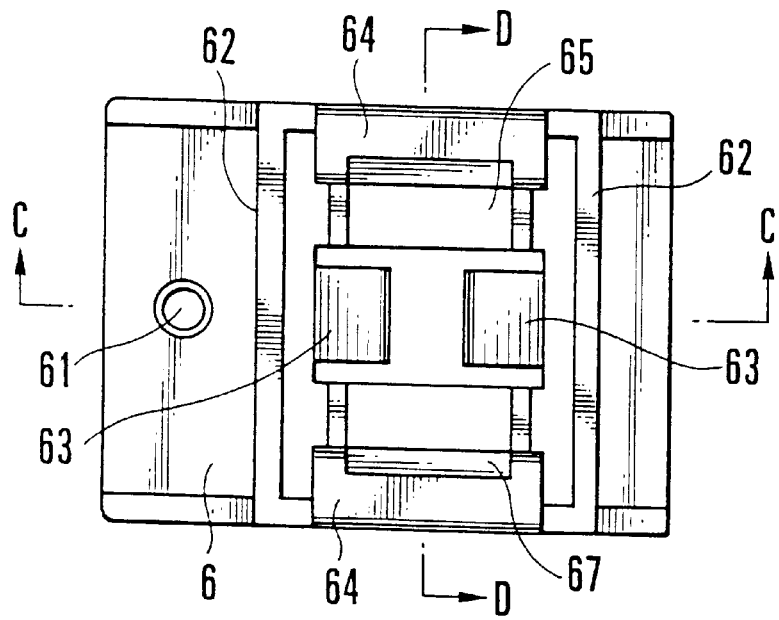
FIG. 5A is a plan view of the fixing base.
Figure 5B:
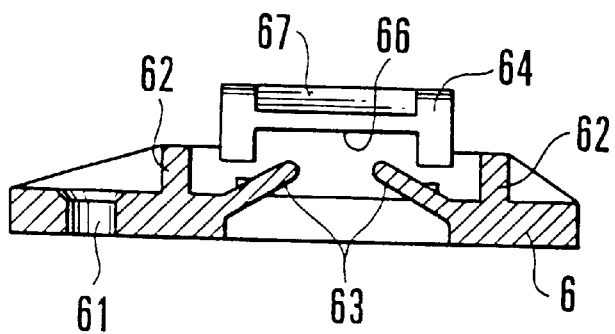
FIG. 5B is a sectional view taken along the line C—C of FIG. 5A.
Figure 5C:
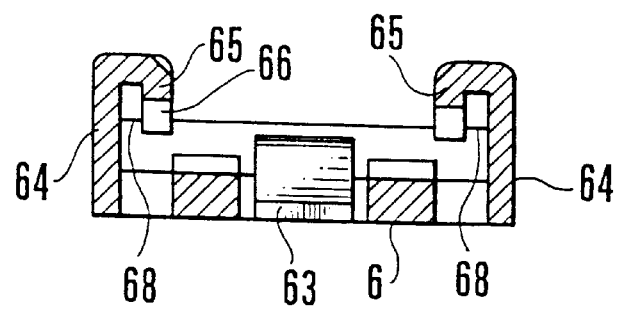
FIG. 5C is a sectional view taken along the line D—D of FIG. 5A.
Figure 6:
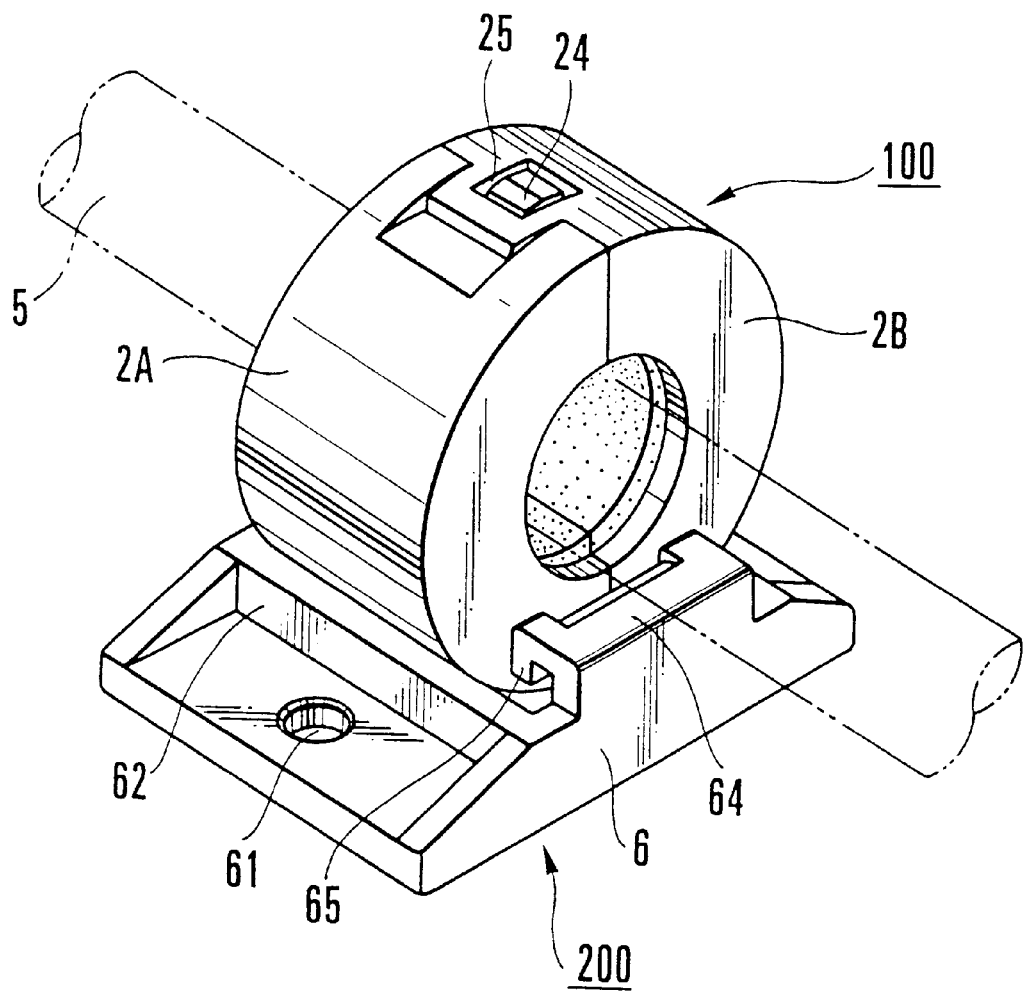
FIG. 6 is a perspective view showing a state wherein the noise absorbing unit is fixed on the fixing base.
Figure 7A:
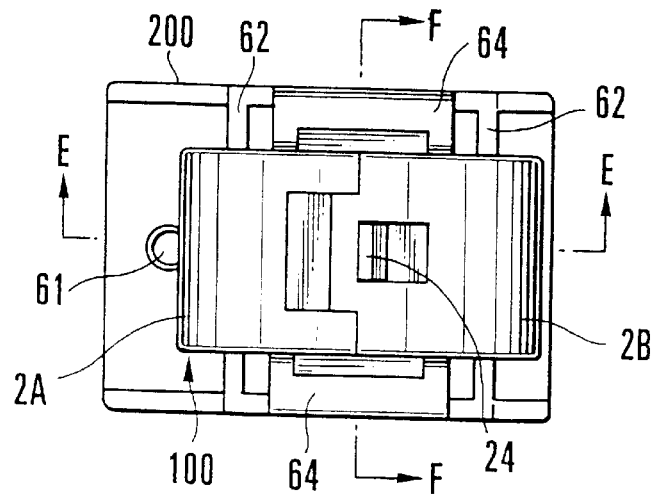
FIG. 7A is a plan view of FIG. 6.
Figure 7B:
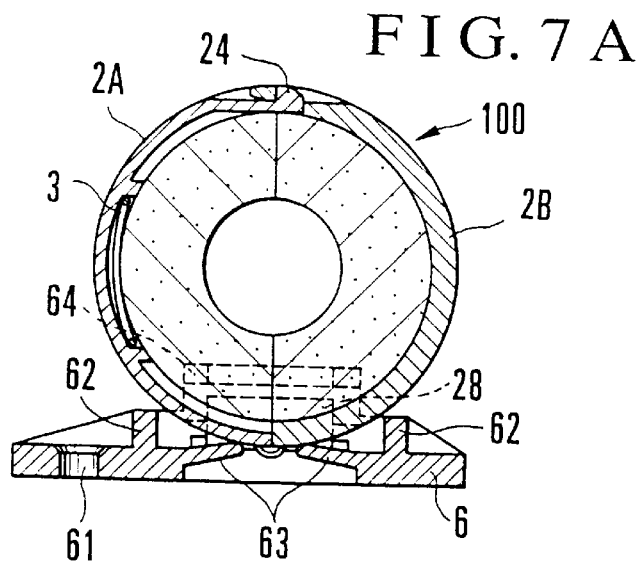
FIG. 7B is a sectional view taken along the line E—E of FIG. 7A.
Figure 7C:
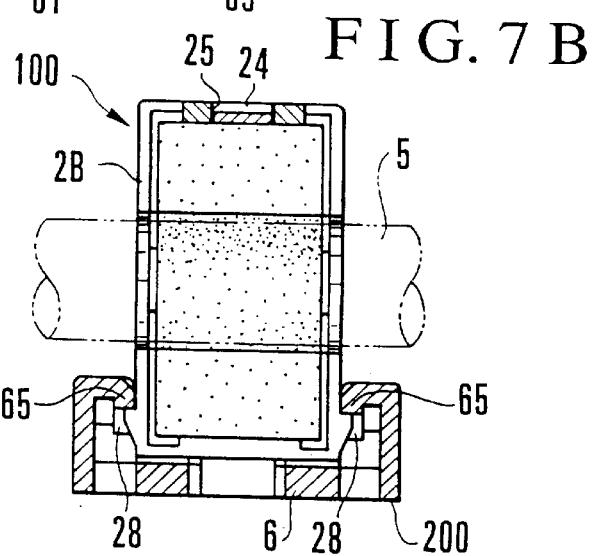
FIG. 7C is a sectional view taken along the line F—F of FIG. 7A.

Therefore, as partly shown in FIG. 4, while a cable 5 is inserted through the respective cylindrical inner surfaces of the ferrite members 1A and 1B, when the covers 2A and 2B swing on the living hinge formed by are bent through the connecting pieces 21 to join each other, they are integrated to oppose each other through engagement between the engaging projecting portion 24 and the engaging hole 25, and the cylindrical container described above is constituted. The cable 5 extends through the opening portions 23. In this state, the ferrite member 1A in one cover 2A is pressed against the other ferrite member 1B with the biasing force of the wire spring 3, so that the flat surfaces 11 of the two ferrite members 1A and 1B come into tight contact with each other. Thus, a closed magnetic circuit enclosing the cable 5 is constituted by the ferrite members 1A and 1B to absorb noise on the cable 5.

In the present invention, a fixing base 200 for fixing and supporting the noise absorbing unit 100 described above is arranged. As shown in FIG. 4 and FIGS. 5A to 5C, the fixing base 200 has a rectangular plate-like base portion 6 whose short sides are slightly longer than the axial length of the noise absorbing unit 100. The noise absorbing unit 100 is supported on the base portion 6 such that its axis is directed toward the short sides of the base portion 6. A screw insertion hole 61 is formed in part of the base portion 6 to fix the base portion 6 on the chassis with a screw. A pair of rails 62 extend on the base portion 6 between the short sides of the base portion 6 to oppose each other along the long sides. The circumference of the noise absorbing unit 100 is partly supported on the rails 62 in a manner to be described later. Cantilevered elastic pieces 63 are formed on the base portion 6 between the rails 62 to oppose each other. Each elastic piece 63 has one end fixed to the base portion 6 and the other end portion inclined slightly upward.

At substantially the central positions of the two long sides of the base portion 6, fitting pieces 64 having a width slightly larger than that of the fitting projections 28 of the noise absorbing unit 100 extend upright to oppose each other. A stepped fitting portion 65 projecting inward is formed on the upper end portion of each fitting piece 64. A notched groove 66 having a size substantially equal to the width of the fitting projection 28 is formed in the central region of each stepped fitting portion 65 excluding its two end portions. A recessed taper portion 67 is formed immediately above the stepped fitting portion 65 to decrease its thickness. Grooves 68 extending through the base portion 6 are formed immediately under the stepped fitting portions 65. The grooves 68 are formed during mold releasing when the stepped fitting portions 65 are molded with a resin.

The base portion 6 of the fixing base 200 is fixed in advance with a screw at a location on, e.g., a chassis, where the cable is disposed. The fixing base 200 is fixed such that the longer sides of the base portion 6 extend along the extending direction of the cable 5. As shown in FIG. 6 and FIGS. 7A to 7C, the cable 5 is disposed on the chassis, and simultaneously the noise absorbing unit 100 is fitted on the fixing base 200, thereby fixing the noise absorbing unit 100 on the chassis. With this fixing operation, the fitting projections 28 of the noise absorbing unit 100 are inserted between the fitting pieces 64 of the fixing base 200. The fitting projections 28 ride over the stepped fitting portions 65 while elastically deforming them outward, and fit in the notched grooves 66. Since the stepped fitting portions 65 are made thin with the notched grooves 66 and the recessed taper portions 67, outward elastic deformation is facilitated.

While the fitting projections 28 are fitted in the notched grooves 66, since the cylindrical surface of the noise absorbing unit 100 elastically deforms the elastic pieces 63 downward, the noise absorbing unit 100 is inversely biased upward by the elastic restoring force of the elastic pieces 63. By this biasing force, the fitting projections 28 and the stepped fitting portions 65 that fit with each other are prevented from being disengaged. Since the fitting projections 28 abut against the respective end faces of the noise absorbing unit 100 with their distal end faces, this abutment prevents the noise absorbing unit 100 from moving in the axial direction, thereby maintaining the fitting projections 28 and the stepped fitting portions 65 to fit with each other in the axial direction. Since the cylindrical surface of the noise absorbing unit 100 is supported between the pair of rails 62 and the fitting pieces 64 remain on the two end portions of the notched groove 66 as relative projecting portions, the fitting projections 28 are clamped by the notched grooves 66 in a direction parallel to the radial direction of the noise absorbing unit 100. Therefore, movement of the noise absorbing unit 100 in the cylindrical direction to disengage the fitting projections 28 from the stepped fitting portions 65 is prevented.

With this arrangement, if only the fixing base 200 is fixed on the chassis in advance, when disposing the cable 5 on the chassis, the cable 5 is inserted through the noise absorbing unit 100, and thereafter the noise absorbing unit 100 is fixed on the fixing base 200. Since the noise absorbing unit 100 can be fixed on the chassis with a single operation, the fixing operation can be facilitated very much.

To remove the noise absorbing unit 100 from the fixing base 200, for example, the noise absorbing unit 100 is separated from the fixing base 200 by twisting. Then, the fitting pieces 64 are also twisted together with the noise absorbing unit 100, and the fitting projections 28 and the stepped fitting portions 65 that fit with each other are disengaged, so that the noise absorbing unit 100 can be removed from the fixing base 200.

Figure 8:
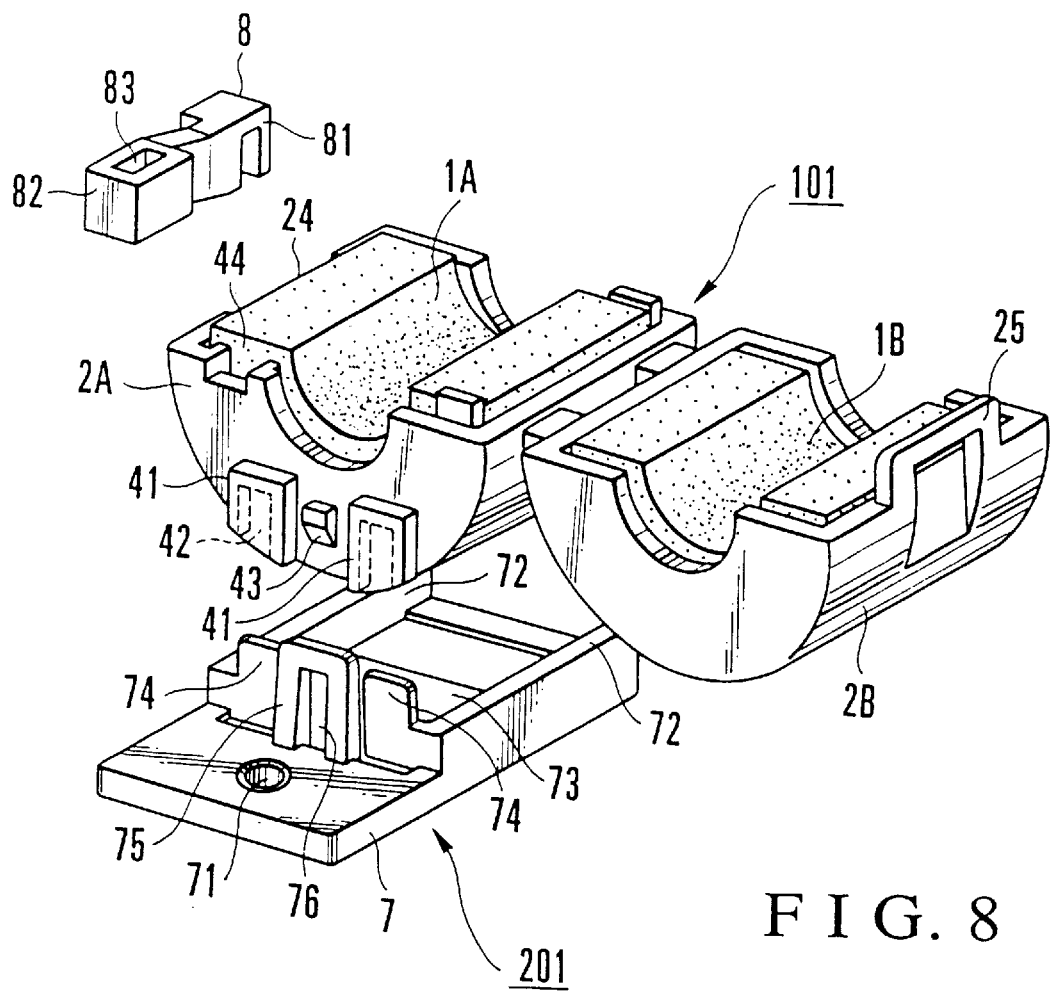
FIG. 8 is a partially exploded perspective view of the second embodiment of the present invention.

FIG. 8 shows the second embodiment of the present invention which is constituted by a noise absorbing unit 101 and a fixing base 201. In the following description, portions equivalent to those of the first embodiment are denoted by the same reference numerals as in the first embodiment. In the noise absorbing unit 101, semicylindrical covers 2A and 2B are connected to each other with living hinge connecting pieces 21, in the same manner as in the first embodiment, and ferrite members 1A and 1B are mounted in the covers 2A and 2B, respectively. When the covers 2A and 2B form the cylindrical container through engagement between an engaging projecting portion 24 formed on the cover 2A and an engaging hole 25 formed in the cover 2B, the ferrite members 1A and 1B are brought into tight contact with each other by the elastic force of a wire spring 3 mounted in the cylindrical container to form a closed magnetic circuit, thereby absorbing the noise of a cable extending through the central hole of the container. This is the same as in the first embodiment.

In the second embodiment, a pair of thick walled portions 41 are integrally formed on one end face of the cover 2A at a predetermined gap in the tangential direction, and fitting grooves 42 that open in directions parallel to each other are formed in the thick walled portions 41 to extend toward the outer circumference of the cover 2A in the downward direction in FIG. 8. Similarly, a rectangular, wedge-shaped latching projecting portion 43 projecting in the axial direction is formed between the thick walled portions 41 on one end face of the cover 2A. The fitting grooves 42 and the latching projecting portion 43 fit on the fixing base 201 in a manner to be described later, and are supported by the fixing base 201. A rectangular notched portion 44 is formed in one straight side edge, of the inner edge on one end side of the cover 2A, extending in the direction of diameter. A band support arm 8 for inserting therein and supporting a fastening band that fastens a cable is supported in the notched portion 44 in a manner to be described later.

More specifically, the fixing base 201 has a rectangular plate-like base portion 7, in the same manner as in the first embodiment, and is fixed on a chassis (not shown) through a screw insertion hole 71 formed in part of the fixing base 201. A pair of support wall portions 72 having substantially the same length as that of the covers 2A and 2B are integrally formed at the two side positions of the upper surface of the base portion 7 to oppose each other. When the noise absorbing unit 101 is placed on the base portion 7 along the longitudinal direction of the support wall portions 72, the outer circumferential surfaces of the covers 2A and 2B can be respectively supported by the support wall portions 72 and be stably supported on the base portion 7. A region sandwiched by the support wall portions 72 is integrally formed with an elastic support piece 73 having a distal end portion directed slightly upward. A pair of fit-in pieces 74 that can fit in the fitting grooves 42 formed in the cover 2A extend upright vertically at positions of the upper surface of the base portion 7 nearer one end portion thereof. A keeper piece 75 having a rectangular keeper hole 76 that can fit on the latching projecting portion 43 formed on the cover 2A extends upright between the fit-in pieces 74.

The cable tie or band support arm 8 has a proximal end portion 81 formed into a downwardly U-shaped gate in the longitudinal direction. With this gate structure, the proximal end portion 81 can fit in the notched portion 44 of the cover 2A. A rectangular band insertion portion 82 is integrally formed on the distal end portion of the cable tie or band support arm 8. An elongated planar band insertion hole 83 extending in the vertical direction in FIG. 8 is formed in the band insertion portion 82.

Figure 9:
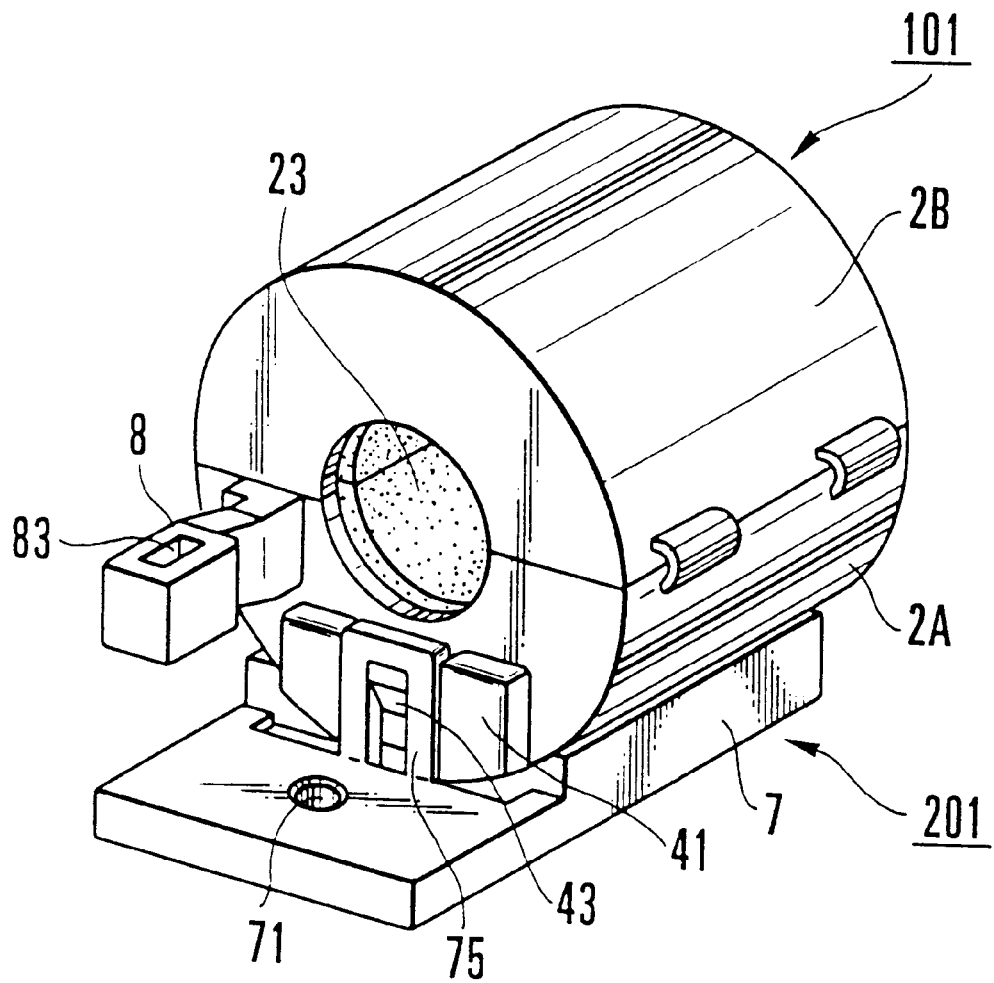
FIG. 9 is a perspective view of the second embodiment of FIG. 8 in an assembled state.

In the noise absorbing unit 101 including the covers 2A and 2B having the above arrangement, before the covers 2A and 2B are assembled, the proximal end portion 81 of the band support arm 8 is fitted in the notched portion 44. Thereafter, a wire spring 3 and the ferrite members 1A and 1B are mounted in the covers 2A and 2B in the manner as indicated in the first embodiment, and the engaging projecting portion 24 of the cover 2A and the engaging hole 25 in the cover 2B are engaged with each other, thereby forming a cylindrical container. Therefore, the proximal end portion 81 of the band support arm 8 is clamped (FIG. 9) by the opposing inner edge portions of the covers 2A and 2B, and the cable tie or band support arm 8 is thus integrated with the noise absorbing unit 101.

When the noise absorbing unit 101 is vertically placed on the fixing base 201 from above, the cylindrical outer circumferential surface of the noise absorbing unit 101 is supported by the pair of support wall portions 72 stably in the circumferential direction.

Figure 10:
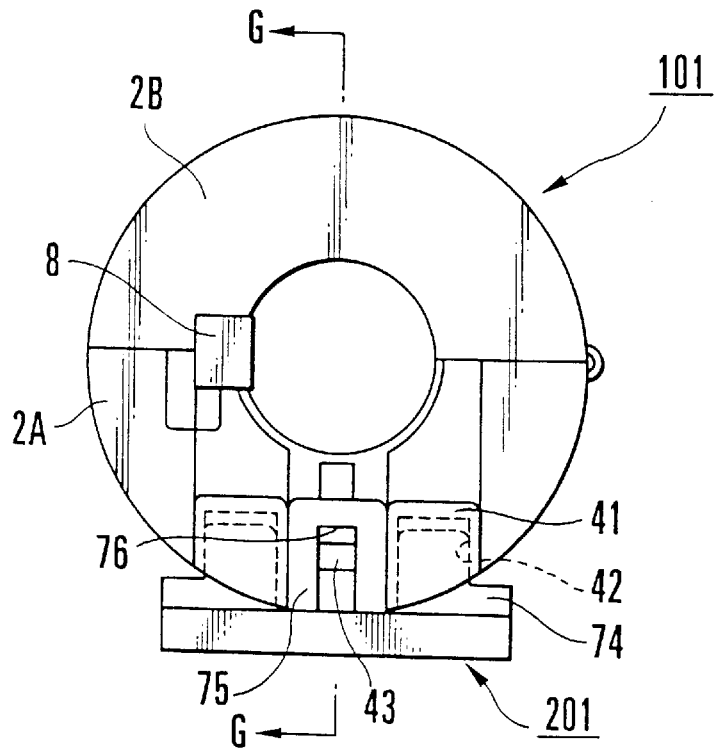
FIG. 10A is a front view of the second embodiment of FIG. 9 in the assembled state.
FIG. 10B is a sectional view taken along the line G—G of FIG. 10A.
Figure 10:
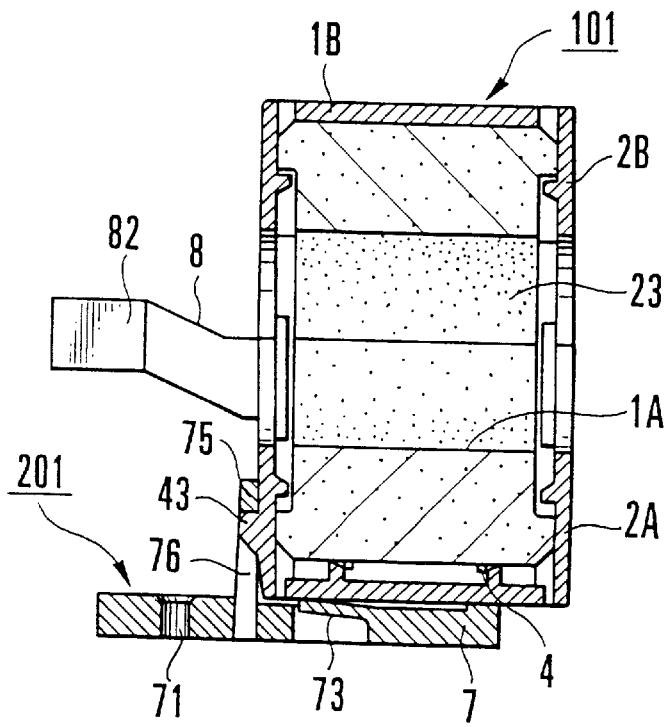

FIGS. 10A and 10B show this state. In this support state, the pair of fit-in pieces 74 of the fixing base 201 are fitted in the pair of fitting grooves 42 formed in the noise absorbing unit 101, and the latching projecting portion 43 formed on the noise absorbing unit 101 is fitted in the keeper hole 76 by utilizing elastic deformation of the fitting piece 75. Accordingly, in this state, since the respective fit-in pieces 74 have a predetermined width and are tightly fitted in the fitting grooves 42 in the direction of thickness, the noise absorbing unit 101 is prohibited from moving in the axial and circumferential directions, and can be positioned with respect to the fixing base 201 in the planar direction.

Since the latching projecting portion 43 fits in the fitting hole 76, the noise absorbing unit 101 is also prohibited from moving upward away from the fixing base 201. At this time, since the elastic support piece 73 of the fixing base 201 is elastically deformed downward by the circumferential surface of the noise absorbing unit 101, it applies an upward force to the noise absorbing unit 101 with the reaction force of the elastic force. By this upward force, the fitting projecting portion 43 is strongly pressed against the upper surface of the keeper hole 76, so that it is prevented from removing from the keeper hole 76. Therefore, vertical backlash between the noise absorbing unit 101 and the fixing base 201 is absorbed, and the noise absorbing unit 101 is stably and firmly fixed and supported.

Figure 11:
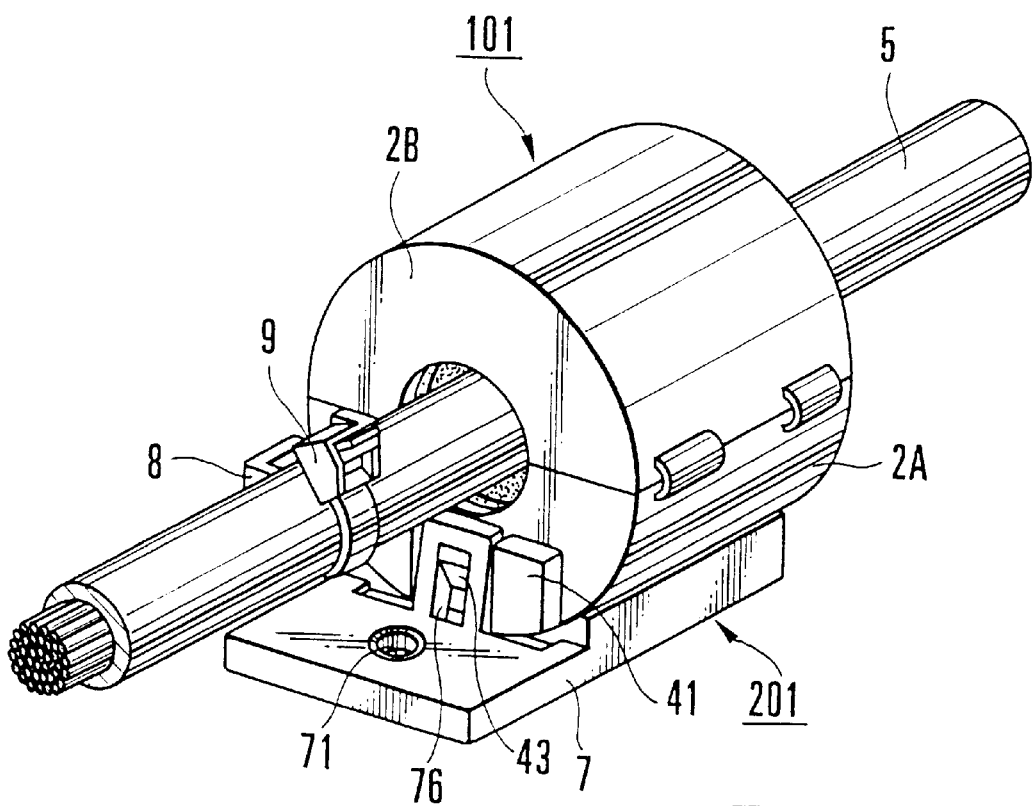
FIG. 11 is a perspective view of the assembly of FIG. 9 wherein the cable is fastened with a fastening band.

Thereafter, as shown in FIG. 11, a known fastening cable tie or band 9 is wound on a cable 5 inserted in opening portions 23 of the noise absorbing unit 101, and the band 9 is partly inserted in the band insertion hole 83 of the cable tie or band support arm 8. When the cable tie or band 9 is fastened, the cable 5 is fastened on the band support arm 8 with the band 9, and is accordingly integrated with the noise absorbing unit 101. By this cable tie or band fastening operation, the cable 5 can be prevented from moving in the opening portions 23 of the noise absorbing unit 101 in the longitudinal direction. The cable 5 can be stably disposed on and supported by the chassis through the fixing base 201.

In the second embodiment, to remove the noise absorbing unit 101 from the fixing base 201, when the keeper piece 75 is elastically deformed outward to disengage the latching projecting portion 43 and the keeper hole 76 from each other, the noise absorbing unit 101 can be lifted vertically upward. Then, the fitting grooves 42 disengage from the fit-in pieces 74, so that the noise absorbing unit 101 can be removed from the fixing base 201. To temporarily remove the cable 5 from the noise absorbing unit 101, this can be achieved without unfastening the cable tie or band 9 by, e.g., cutting, but by releasing the cable tie or band support arm 8 from the covers 2A and 2B and removing the band support arm 8 from the noise absorbing unit 101. Also, only the cable 5 can be removed from the noise absorbing unit 101 by disengaging the covers 2A and 2B from each other while the noise absorbing unit 101 stays fixed on the fixing base 201.

Figure 12:
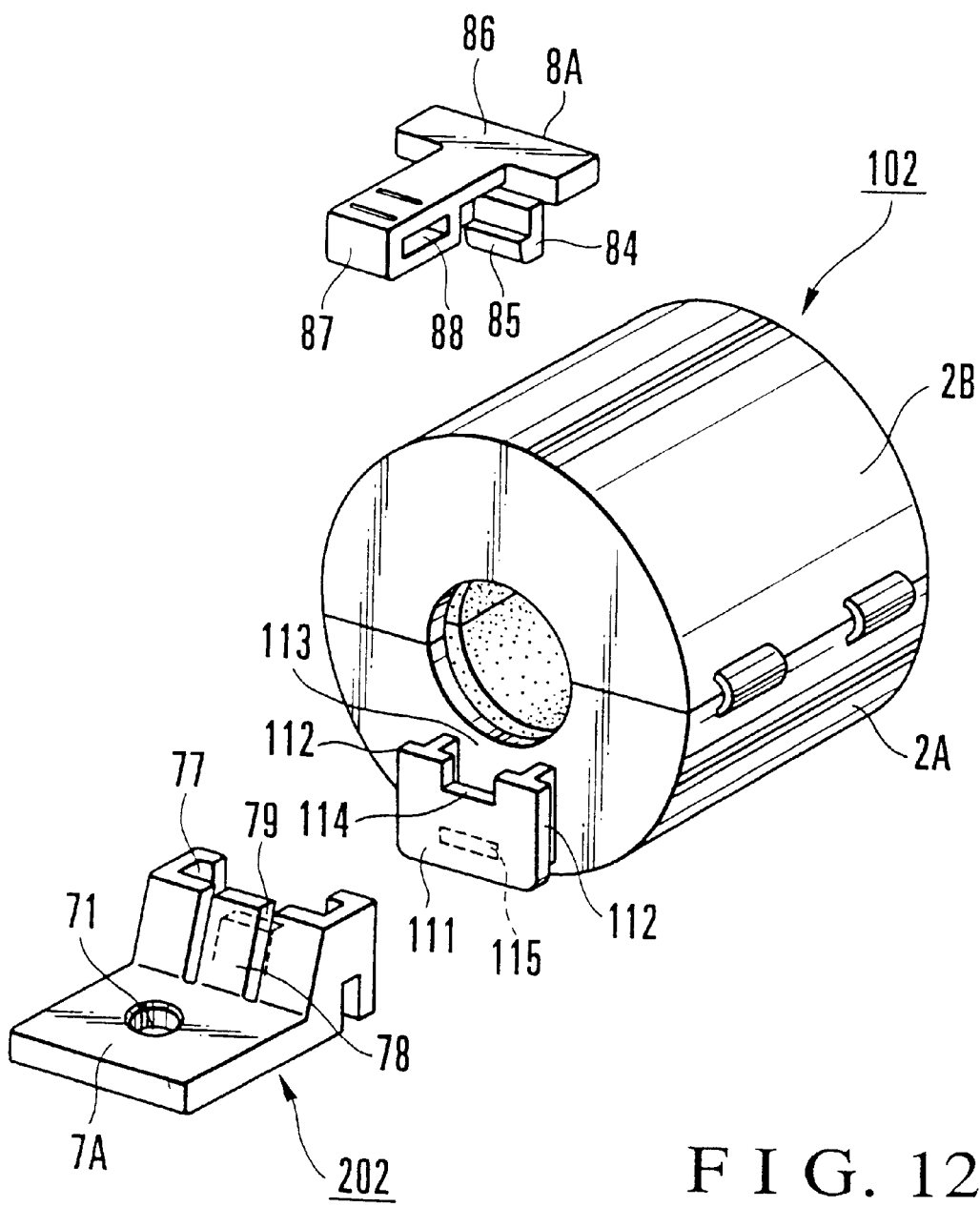
FIG. 12 is a partially exploded perspective view of the third embodiment of the present invention.

FIG. 12 shows the third embodiment of the present invention. The internal structure of a noise absorbing unit 102 is the same as those of the first and second embodiments. A fixing base 202 is arranged in order to fix and support the noise absorbing unit 102 on the chassis, and a band support arm 8A of a fastening band that fastens a cable is arranged, which are the same as in the second embodiment. In the third embodiment, a thick walled portion 111 from which wing pieces 112 project to the right and left in the tangential direction is integrally formed on part of the circumference of one end face of a cover 2A of the noise absorbing unit 102. A fitting groove 113 is formed at the central position of the thick walled portion 111 to extend in the radial direction. A rectangular recessed portion 114 is formed in the upper edge portion of the fitting groove 113. A horizontally extending rib 115 is integrally formed on the inner surface of the fitting groove 113 immediately under the recessed portion 114, to project from it.

The fixing base 202 is formed of a base portion 7A made of an L-shaped plate-like small piece, and a screw insertion hole 71 for fixing the fixing base 202 on the chassis is formed in the flat plate-like portion of the base portion 7A. The upright wall portion of the fixing base 202 is thick, and fitting grooves 77 that can fit on the wing pieces 112 of the thick walled portion 111 of the noise absorbing unit 102 are formed in the upright wall portion to extend in the vertical direction. The central portion of the upright wall portion in the widthwise direction forms a cantilevered locking piece 78 with a pair of slits formed in the widthwise direction of the fitting grooves 77. A wedge-shaped locking projection 79 is formed on the upper edge portion of the locking piece 78 to be pointed toward the inner surface.

The band support arm 8A is formed of a flat T-shaped plate member. A fit-in piece 84 formed with a locking projection 85 having a wedge-shaped distal end is formed on the lower surface of a proximal end portion 86, having a large width, of the band support arm 8A to project vertically downward. The fit-in piece 84 can fit in the fitting groove 113 of the noise absorbing unit 102. A distal end portion 87 of the band support arm 8A is slightly thick, and a band insertion hole 88 is formed in the distal end portion 87 to extend in the horizontal direction.

Figure 13:
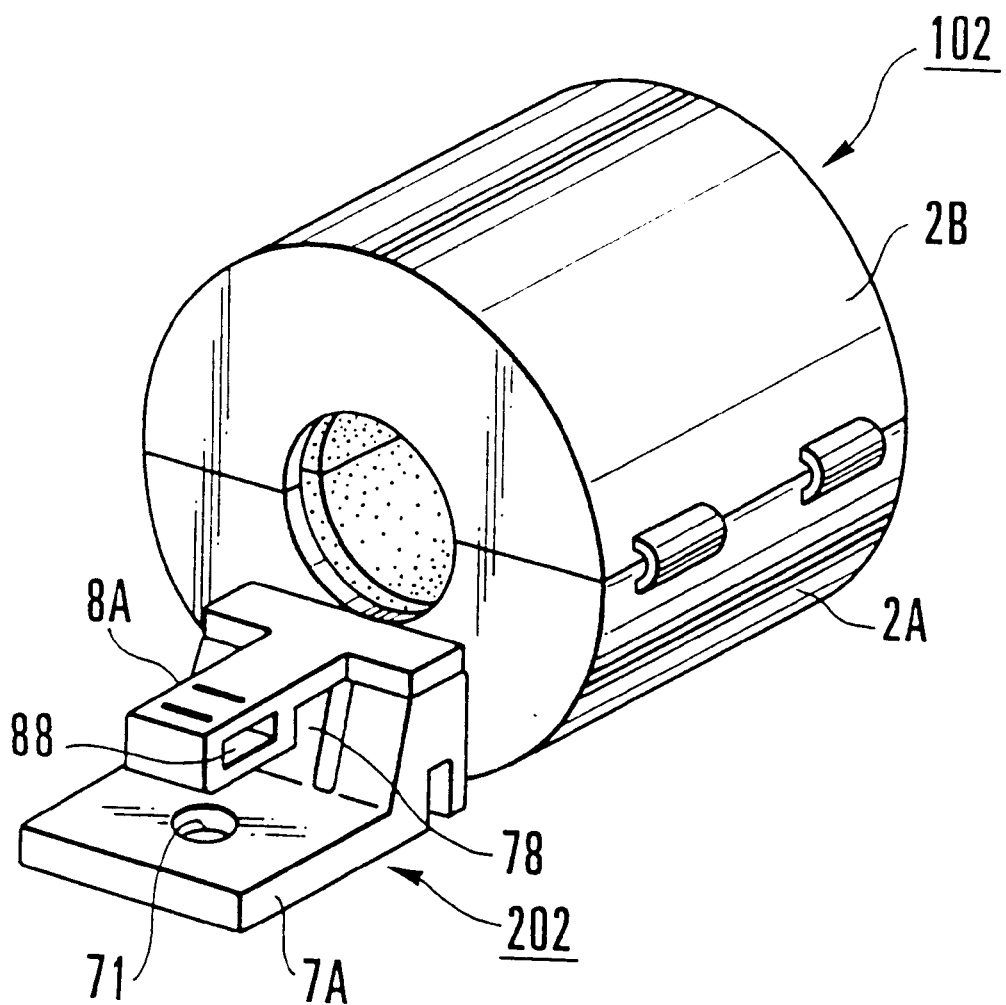
FIG. 13 is a perspective view of the third embodiment of FIG. 12 in an assembled state.

With this arrangement, the cover 2A and a cover 2B of the noise absorbing unit 102 are closed while mounting ferrite members 1A and 1B therein, and a cable 5 is inserted in opening portions 23 of the covers 2A and 2B. These operations are the same as in the above embodiments. The fixing base 202 is fixed on the chassis by utilizing the screw insertion hole 71, which is also the same as in the above embodiments. Then, as shown in FIGS. 13 and 14, the noise absorbing unit 102 is placed on the fixing base 202 such that the wing pieces 112 of the thick walled portion 111 of the noise absorbing unit 102 are fitted in the fitting grooves 77 of the fixing base 202. Since the locking piece 78 formed on the fixing base 202 is elastically deformed and its locking projection 79 engages with the recessed portion 114 formed in the upper edge of the thick walled portion 111, this engagement force prevents the wing pieces 112 from disengaging from the fitting grooves 77, thereby preventing the noise absorbing unit 102 from removing from the fixing base 202.

Figure 15:
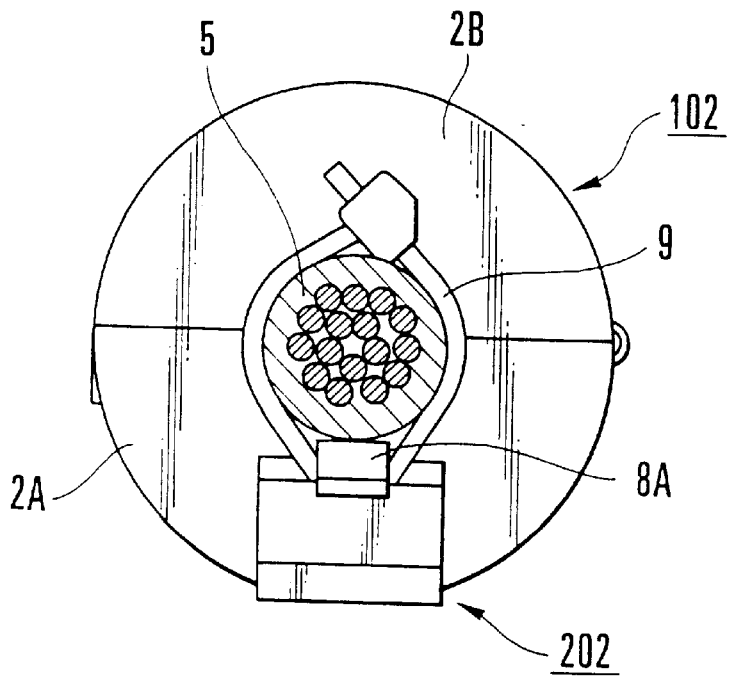
FIGS. 15A and 15B are front and left side views, respectively, of the assembly in which the cable is fastened with the fastening band.
Figure 15:
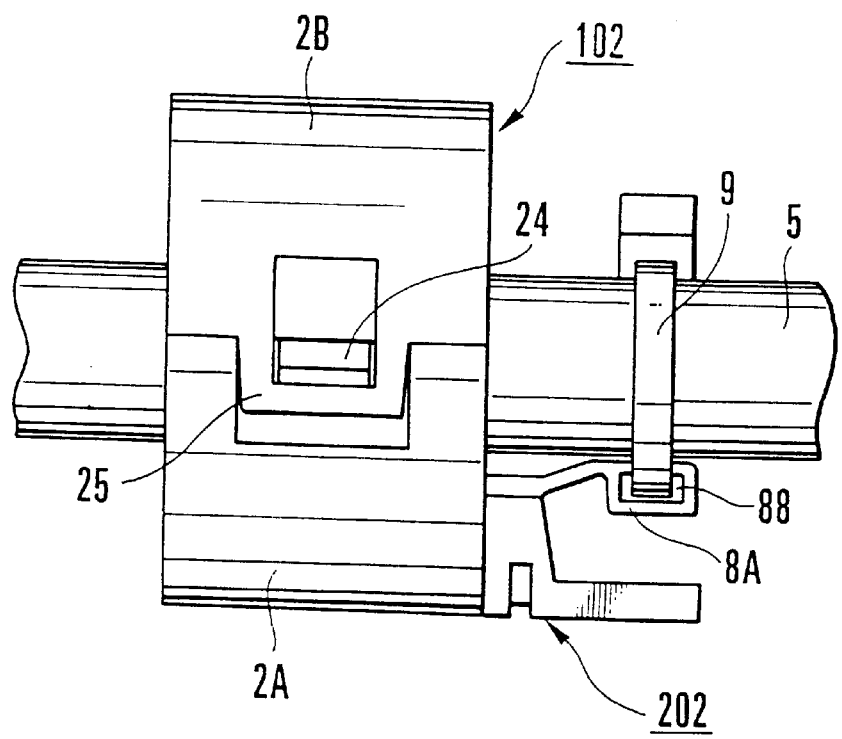

The fit-in piece 84 at the proximal end portion of the band support arm 8A is fitted in the fitting groove 113 of the thick walled portion 111 of the noise absorbing unit 102. By this fitting operation, the locking projection 85 at the distal end of the fit-in piece 84 is locked by the rib 115 of the fitting groove 113, and this locking force prevents the band support arm 8A from removal from the noise absorbing unit 102. After this, as shown in FIGS. 15A and 15B, a fastening band 9 is inserted in the band insertion hole 88 of the band support arm 8A, and the cable 5 extending through the noise absorbing unit 102 is fastened with the band 9. Therefore, the band support arm 8A and the cable 5 can be integrally fastened with each other, and the cable 5 can be fixed and supported. In this case, the band support arm 8A may be integrated with the noise absorbing unit 102 in advance by fitting them with each other, as a matter of course.

In this embodiment, when the locking piece 78 of the fixing base 202 is elastically deformed outward, the locking projection 79 disengages from the recessed portion 114, so that the wing pieces 112 and the thick walled portion 111, i.e., the noise absorbing unit 102, can be removed from the fixing base 202. The locking projection 85 of the fit-in piece 84 of the band support arm 8A is merely locked with the rib 115 of the fitting groove 113. When the band support arm 8A is pulled strong, the locking projection 85 can disengage from the rib 115 and the band support arm 8A can be removed from the noise absorbing unit 102. In particular, this third embodiment is more advantageous than the second embodiment in that even if the covers 2A and 2B are closed together, the band support arm 8A can be attached and detached.

Figure 16:
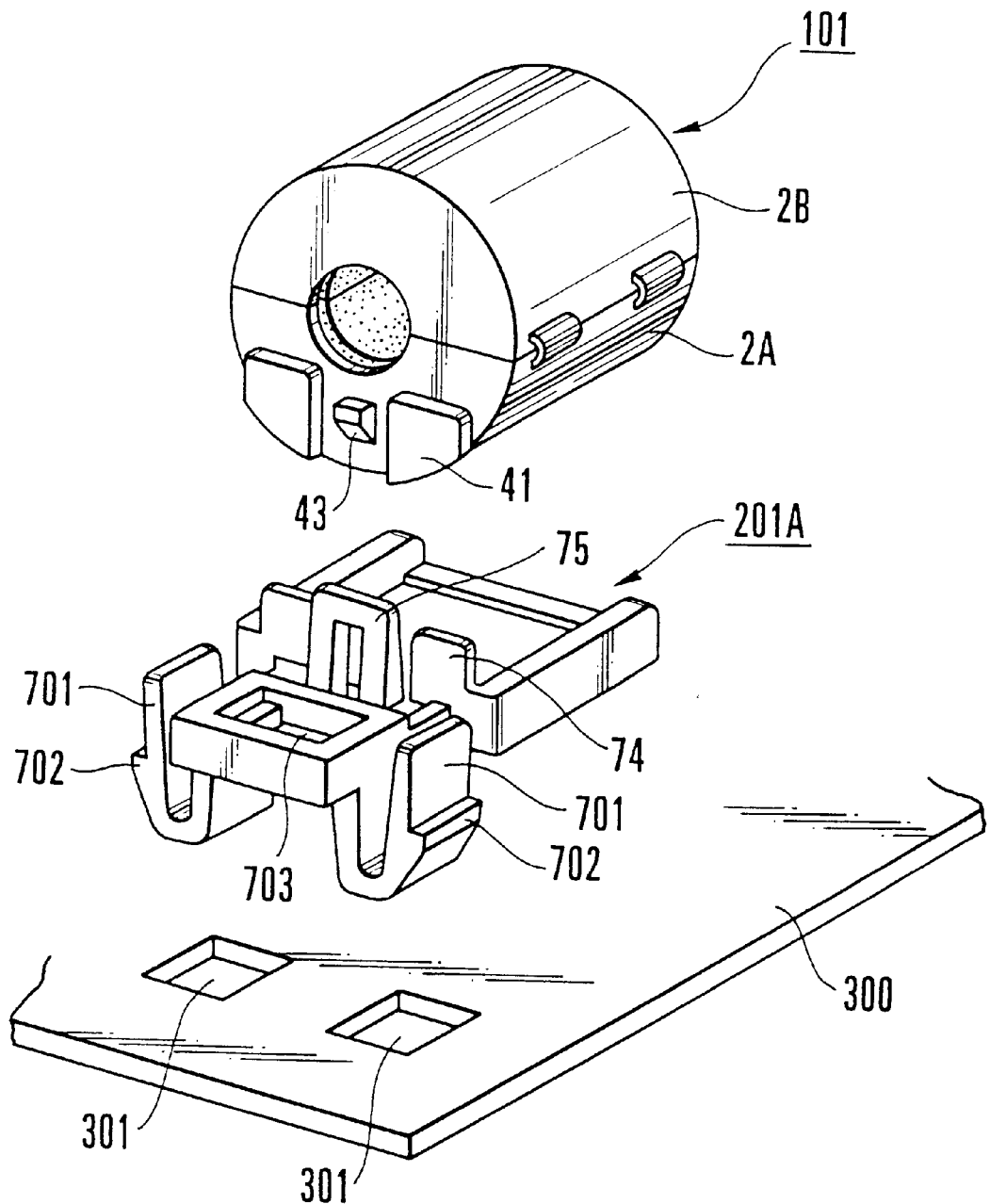
FIG. 16 is a partially exploded perspective view of a modification of the second embodiment of the present invention.
Figure 17:
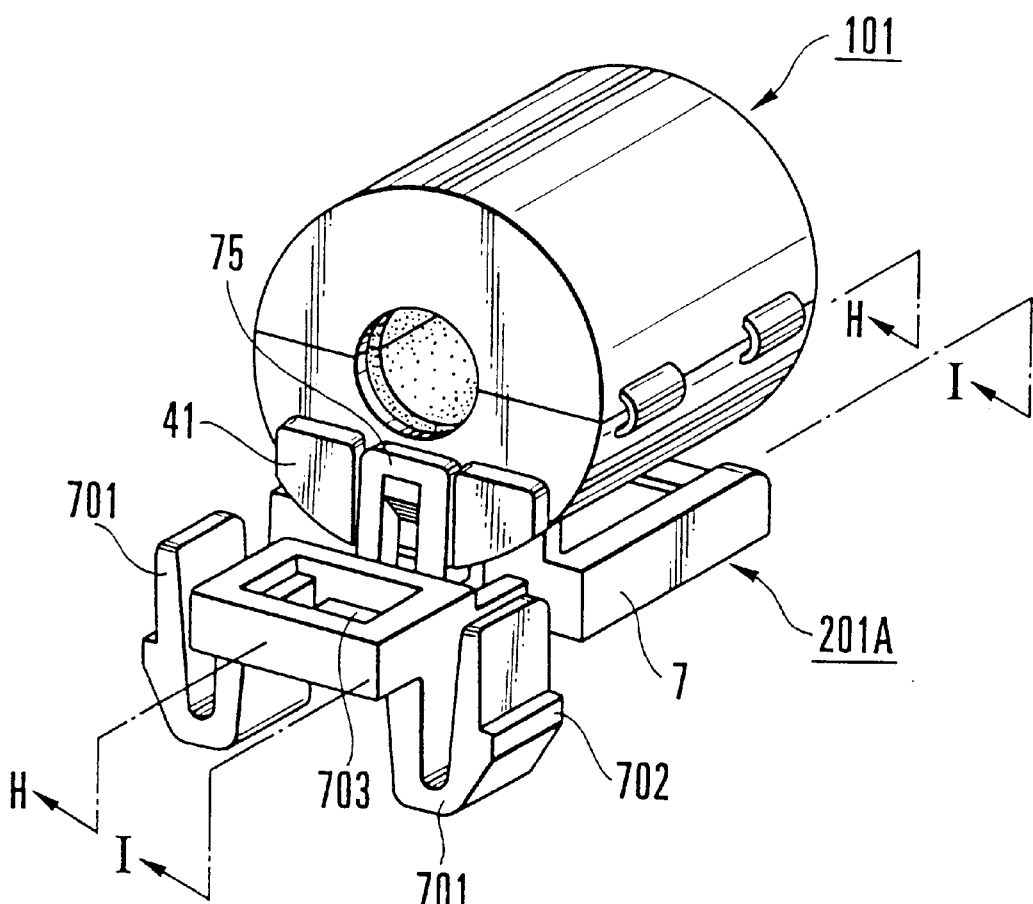
FIG. 17 is a perspective view of a state wherein the noise absorbing unit and the fixing base shown in FIG. 16 are assembled.
Figure 18:
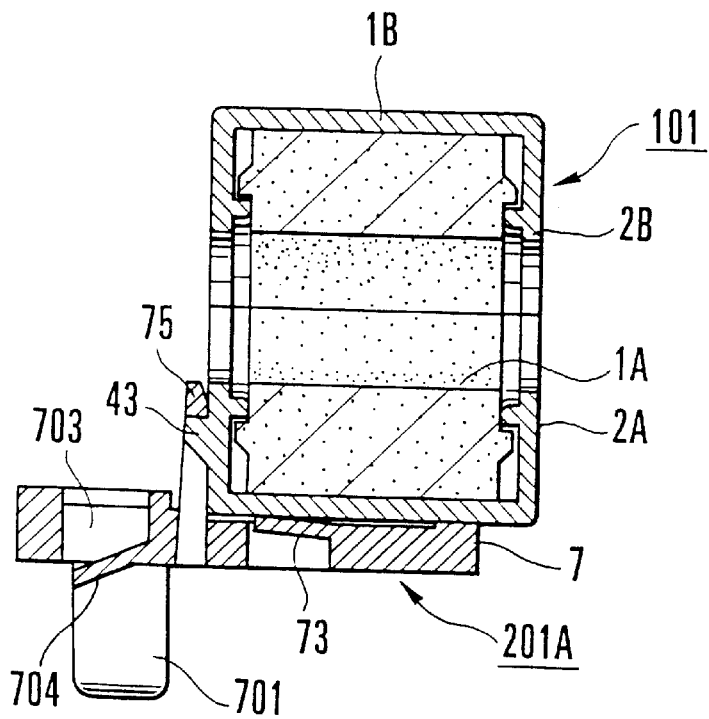
FIGS. 18A and 18B are sectional views taken along the lines H—H and I—I, respectively, of FIG. 17.
Figure 18:
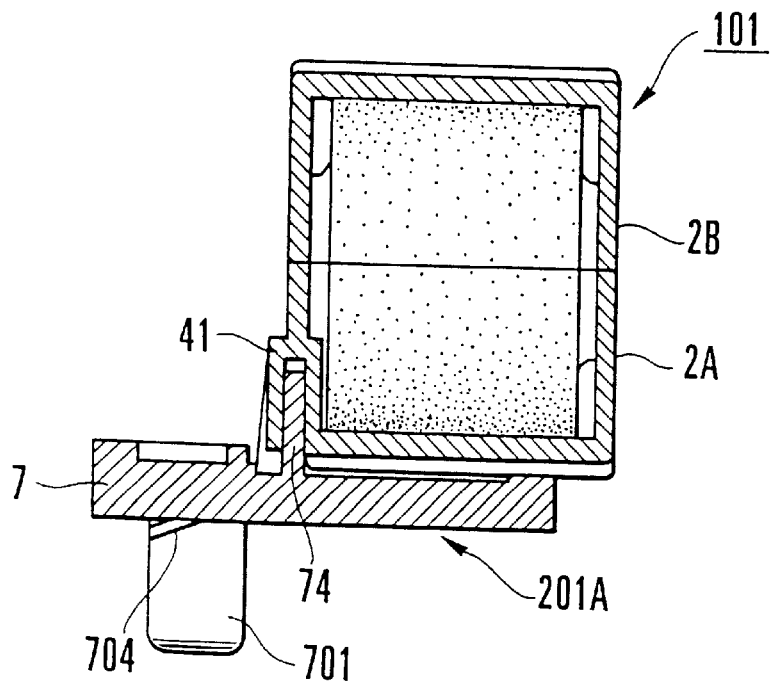

FIG. 16 shows a modification of the second embodiment shown in FIGS. 8 to 11, and FIG. 17 and FIGS. 18A and 18B show this modification in an assembled state. In this modification, clip portions are formed on a fixing base 201A, so that the fixing base 201A or a noise absorbing unit 101 can be fixed on a chassis 300 with a single operation. The noise absorbing unit 101 is not formed with a cable tie or band support arm corresponding to the band support arm 8 of the second embodiment.

In the fixing base 201A, portions equivalent to those of the second embodiment are denoted by the same reference numerals, but in place of the screw insertion hole 71 of the second embodiment, clip pieces 701 projecting to the lower surface side are formed on the two side edges of a base portion 7. Each clip piece 701 is substantially U-shaped and has one end portion integrally connected to the base portion 7 and the other end portion which is elastically deformable in the direction of thickness. A stepped engaging portion 702 having a varying thickness is formed on part of each clip piece 701. A rectangular window 703 is formed in the base portion 7 between the clip pieces 701 to extend in the direction of thickness of the base portion 7. A cantilevered pressing piece 704 having a distal end portion projecting to the lower surface side is disposed in the window 703.

Regarding fixing and supporting the noise absorbing unit 101 on the fixing base 201A by using the fixing base 201A having the above arrangement, it can be performed completely in the same manner as in the second embodiment, except that an operation of mounting the cable tie or band support arm 8 on the noise absorbing unit 101 is not present in this modification. To fix the fixing base 201A on the chassis 300, a pair of small rectangular holes 301 corresponding to the clip pieces 701 may be formed in the chassis 300 in advance, and the clip pieces 701 may be fitted in the rectangular holes 301.

Figure 19:
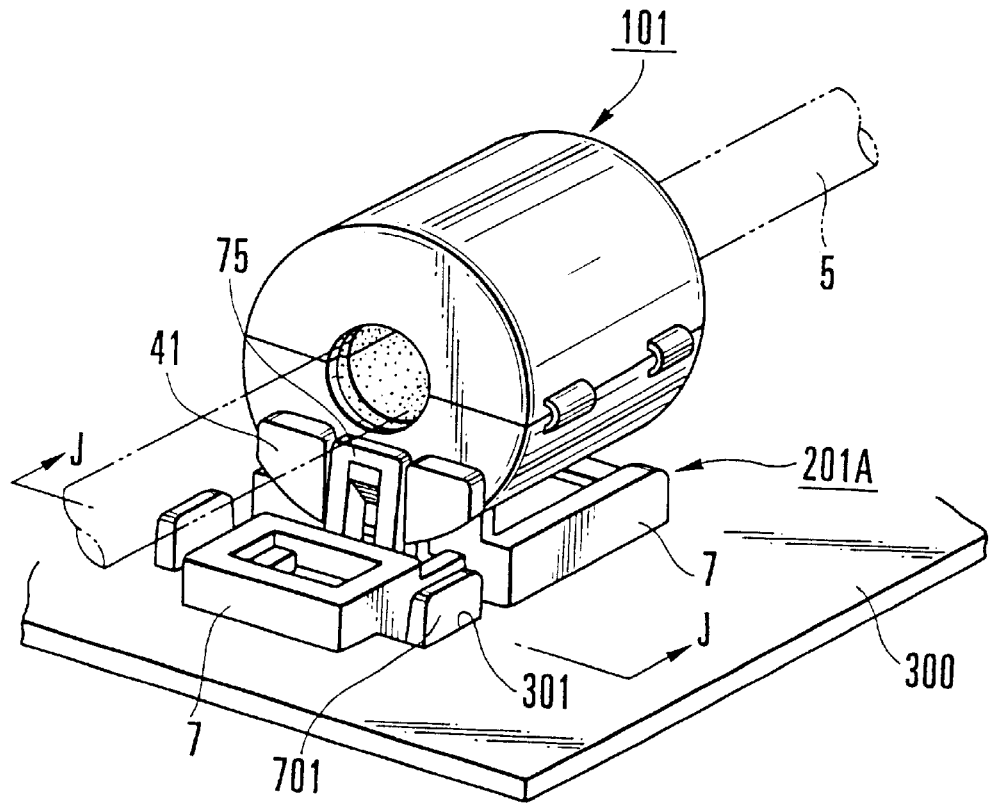
FIG. 19A is a perspective view showing the modification of FIG. 16 in an assembled state.
FIG. 19B is a sectional view taken along the line J—J of FIG. 19A.
Figure 19:
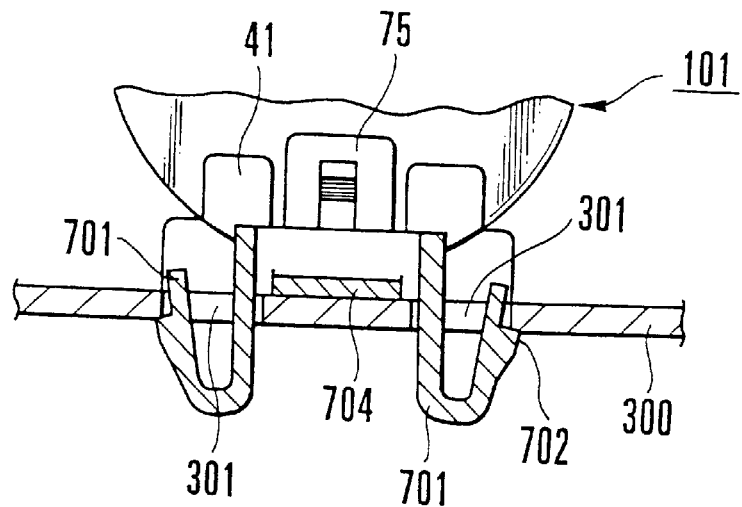

As shown in FIG. 19A showing the outer appearance and FIG. 19B showing the sectional view taken along the line J—J of FIG. 19A, each clip piece 701 is inserted in the corresponding rectangular hole 301 while being elastically deformed. Thereafter, the stepped engaging portion 702 at the other end portion of each clip piece 701 is engaged in the edge portion of the corresponding rectangular hole 301 by its own elastic force. The fixing base 201A is mounted on the chassis 300 by this engaging force. At this time, the distal end portion of the pressing piece 704 is brought into elastic contact with the surface of the chassis 300, and the reaction force of this elastic contact presses the fixing base 201A upward.

For this reason, engagement between the stepped engaging portions 702 of the respective clip pieces 701 and the edge portions of the rectangular holes 301 is held in a stable state, and the fixing base 201A is thus firmly mounted on the chassis 300. To remove the fixing base 201A from the chassis 300, the other end portion of each of the pair of clip pieces 701 projecting upward from the surface of the chassis 300 may be held with fingers and be elastically deformed to be narrowed, so that the stepped engaging portions 702 and the edge portions of the rectangular holes 301 can be disengaged from each other. Then, the fixing base 201A is lifted upward so that it is removed.

In this manner, in this modification, the fixing base 201A can be mounted on and detached from the chassis 300 with the pair of clip pieces 701 by a single operation. The noise absorbing unit 101 can be mounted on and detached from the fixing base 201A by a single operation completely in the same manner as in the second embodiment. Therefore, the noise absorbing units can be mounted on and detached from various types of equipments very easily. Regarding the rectangular holes 301, even if the length between the opposing sides that do not directly concern engagement with the stepped engaging portions 702 of the clip pieces 701, i.e., even if their length in a direction parallel to a cable 5 inserted through the noise absorbing unit, is larger than the width of the clip piece 701, the clip pieces 701 can engage with the rectangular holes 301. When the rectangular holes 301 are formed to be slightly long in a direction along the cable 5, the mounting positions of the fixing base 201A and the noise absorbing unit 101 can be adjusted along the cable 5. When adjusting the mounting position of the noise absorbing unit, this modification is more effective in this respect than in the above embodiments in which the fixing base is mounted on the chassis with a screw.

Figure 21:
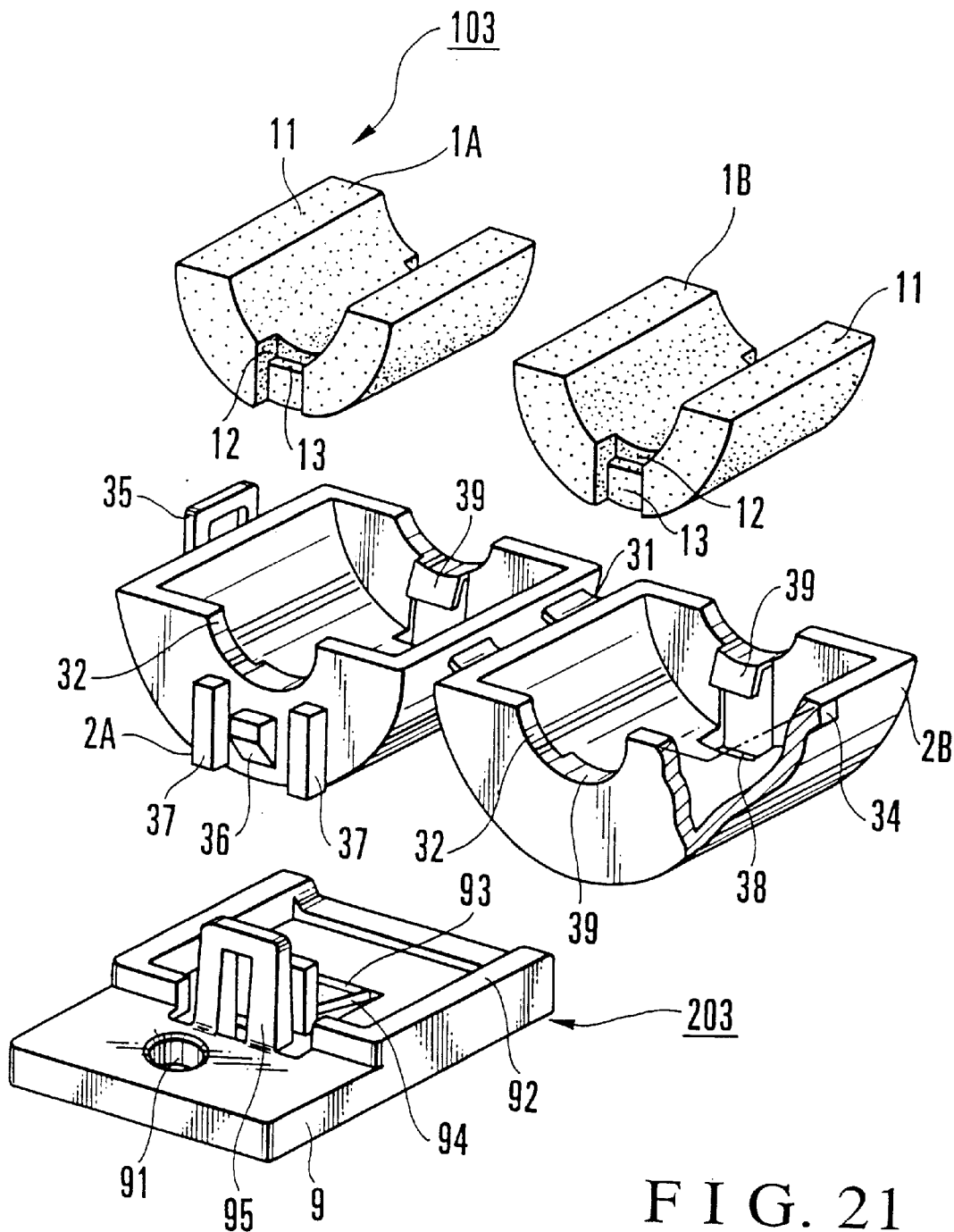
FIG. 21 is a partially exploded perspective view of a noise absorbing apparatus shown in FIG. 20.

FIGS. 20 and 21 show a noise absorbing unit 103 and a fixing base 203 constituting a noise absorbing apparatus according to the fourth embodiment of the present invention. The noise absorbing unit 103 is constituted by a pair of semicylindrical ferrite members 1A and 1B and covers 2A and 2B forming corresponding semicylindrical containers and integrated for mounting therein and supporting the ferrite members 1A and 1B, respectively. When the ferrite members 1A and 1B are brought into contact with each other to clamp a noise absorbing cable therebetween such that their flat surfaces 11 located along their diameters oppose each other, they form a closed magnetic circuit to absorb and remove noise superposed on a signal transmitted through the cable. This noise absorbing operation is already known widely and a description thereof will be omitted. Recessed support portions 12 are formed on the two end faces in the axial direction of each of the ferrite members 1A and 1B at positions along the inner circumferential surfaces, so that the ferrite members 1A and 1B are mounted in and supported by the covers 2A and 2B. The recessed support portions 12 are formed with stepped portions 13 at their inner bottom surfaces. These stepped portions 13 are utilized when mounting the ferrite members 1A and 1B in the covers 2A and 2B, as will be described later.

The covers 2A and 2B are made of a resin while they are integrally connected to each other through a pair of connecting pieces 31 at one side portion of each cover. The covers 2A and 2B can be opened and closed due to the flexibility of the connecting pieces 31. When they are closed, the covers 2A and 2B constitute a short cylindrical container. Semicircular inner edge portions 32 of the covers 2A and 2B form opening portions 33 on the two end faces of the cylindrical container. An arrowhead-shaped engaging projecting portion 34 projects from the other side portion of one cover 2B, among the covers 2A and 2B, in the tangential direction of the cylindrical surface of the cover 2B. An engaging frame portion 35 is formed in the other side portion of the other cover 2A. The projecting portion 34 is inserted in and engages with the engaging frame portion 35.

Figure 22:
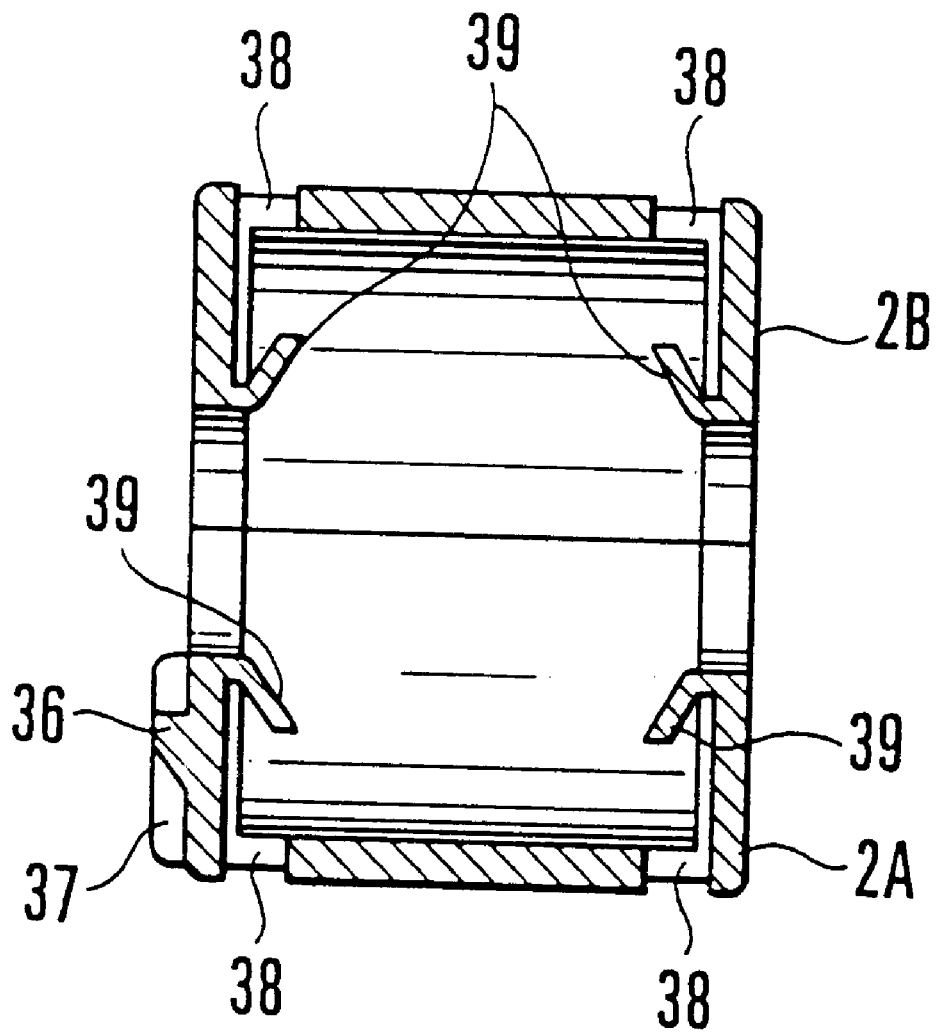
FIG. 22 is a longitudinal sectional view of covers in an assembled state.

A wedge-shaped fitting projection 36 projecting in the axial direction is formed on one end face in the axial direction of the cover 2A and is utilized when fixing the noise absorbing unit 103 on the fixing base 203. A pair of prismatic guides 37 extending substantially in the radial direction are formed to project on two side positions sandwiching the fitting projection 36, and are utilized as guides when fixing the noise absorbing unit 103 on the fixing base 203. Furthermore, fitting grooves 38 are formed on sides of the semicylindrical outer circumferential surface nearer the two ends at substantially the central positions of each of the covers 2A and 2B, to extend from the outer circumferential surface inward in the direction of diameter. A tongue-shaped locking piece 39 is formed on the inner-diameter side end portion of each fitting groove 38 to project slightly radially outward from the inner end face of the corresponding cover. These locking pieces 39 are formed by utilizing the fitting grooves 38 when molding the covers 2A and 2B with a resin. In other words, the fitting grooves 38 are used as mold release grooves when molding the locking pieces 39. FIG. 22 shows the covers 2A and 2B that are assembled together into a cylinder.

Figure 23:
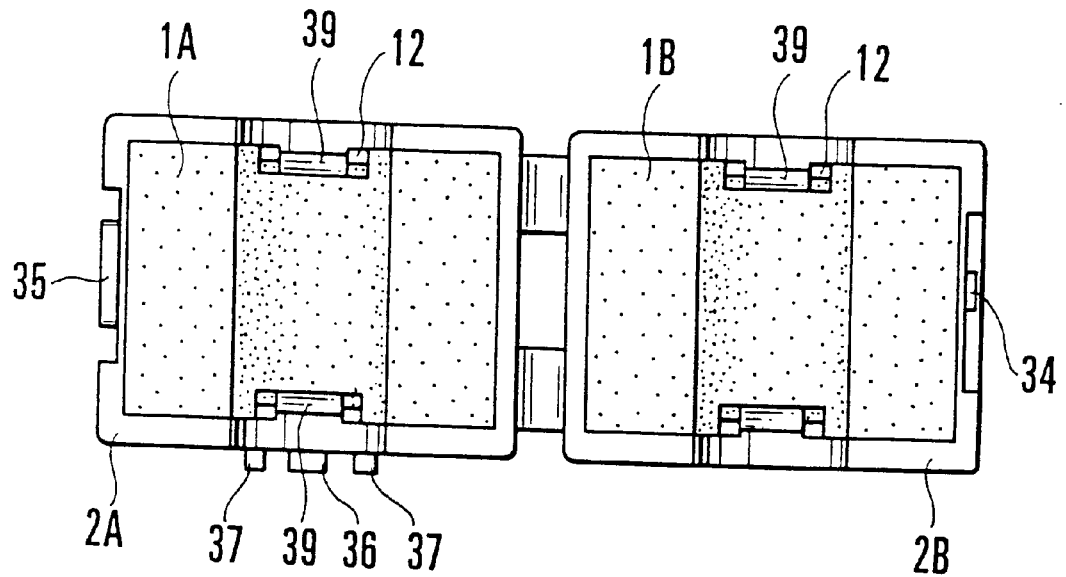
FIG. 23A is a plan view of a noise absorbing unit in a developed state in which ferrite members are incorporated in covers.
FIG. 23B is a longitudinal sectional view of the noise absorbing unit in the assembled state.
Figure 23:
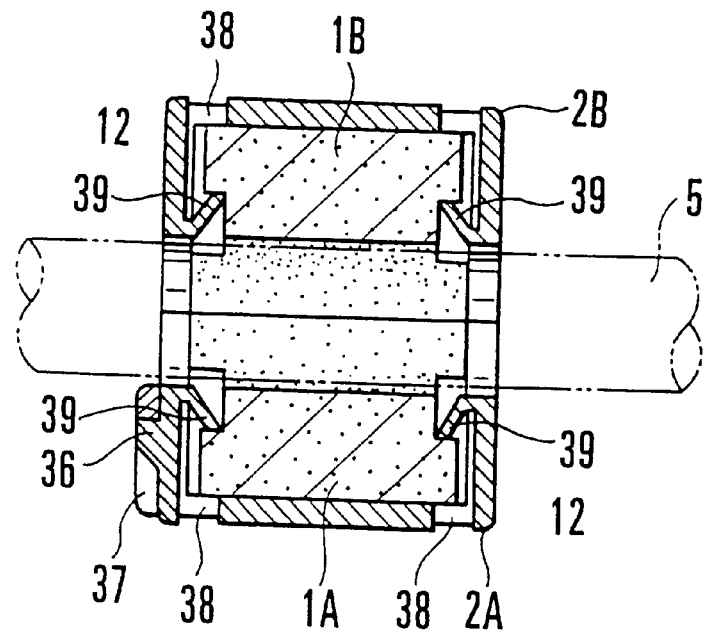

In this arrangement, the ferrite members 1A and 1B are mounted in the covers 2A and 2B, respectively, as shown in FIGS. 23A and 23B. FIG. 23A shows the covers 2A and 2B in an open state, and FIG. 23B shows the covers 2A and 2B in an assembled state. Regarding this mounting, the ferrite members 1A and 1B need only be pushed into the covers 2A and 2B such that their cylindrical surfaces are pointed to them. Then, the recessed support portions 12 formed in the ferrite members 1A and 1B ride over the distal end portions of the locking pieces 39 while elastically deforming the locking pieces 39, and the locking pieces 39 are then elastically restored to engage with the stepped portions 13 of the recessed support portions 12, thereby realizing this locking. The ferrite members 1A and 1B are thus prevented from coming out from the covers 2A and 2B. In this case, it is preferable that an elastic member (not shown) be interposed between one ferrite member and the inner surface of the corresponding cover, e.g., between the ferrite member 1A and the cover 2A, and this one ferrite member be pushed toward the other ferrite member with the elastic force of this elastic member, so that the flat surfaces of the two ferrite members are brought into tight contact with each other. Therefore, if a cable 5 is inserted between the ferrite members 1A and 1B, as indicated by an imaginary line, the ferrite members 1A and 1B constitute a closed magnetic circuit enclosing the cable 5, and the noise on the cable 5 is absorbed by the closed magnetic circuit.

Figure 24:
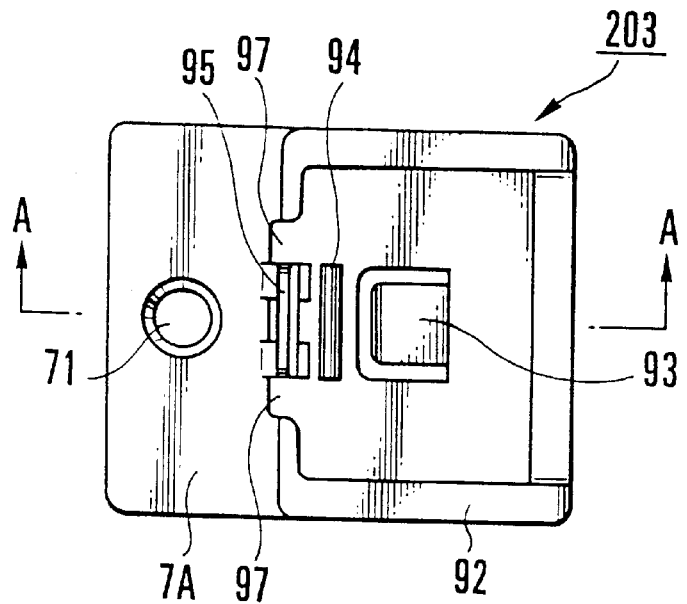
FIG. 24A is a plan view of a fixing base.
FIG. 24B is a sectional view taken along the line A—A of FIG. 24A.
FIG. 24C is a left side view of the fixing base.
Figure 24:
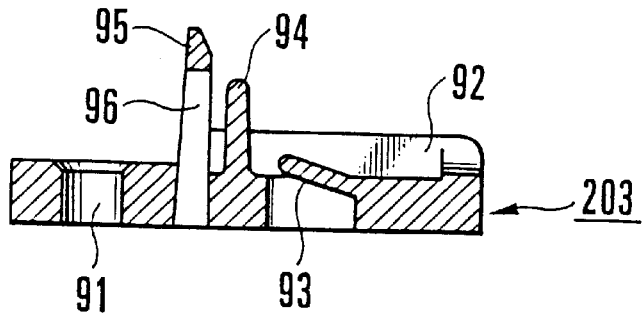
Figure 24:
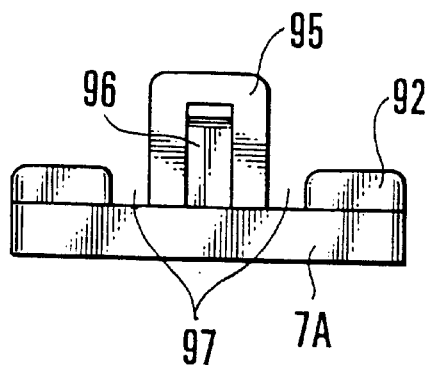

The fixing base 203 has a rectangular plate-like base portion 7A, as shown by the plan view of FIG. 24A, the sectional view of FIG. 24B taken along the line A—A of FIG. 24A, and the left side view of FIG. 24C, and is fixed on a chassis (not shown) through a screw insertion hole 91 formed in part of the fixing base 203. A frame-shaped support wall portion 92 having opposing sides with substantially the same length as that of the covers 2A and 2B in the axial direction are integrally formed at a position on the upper surface of the base portion 7A. When the noise absorbing unit 103 is placed on the base portion 7A, the outer circumferential surfaces of the covers 2A and 2B can be supported by the support wall portion 92 and thus be stably supported on the base portion 7A. A region sandwiched by the support wall portion 92 is integrally formed with an elastic support piece 93 having a distal end portion directed slightly upward. A fit-in piece 94 having a width and thickness with which it can fit in the corresponding fitting groove 38 formed in the cover 2A extends upright vertically at a position of the upper surface of the base portion 7A nearer the center thereof. A fitting piece 95 having a rectangular fitting hole 96 that can fit on the fitting projecting portion 36 formed on the cover 2A extends upright at a position opposing the fit-in piece 94 through a small gap. Notched portions 97 formed by partly notching the support wall portion 92 are formed along the two sides of the fitting piece 95. The lower end portions of the guides 37 of the noise absorbing unit 103 can enter the notched portions 97.

With this arrangement, if only the fixing base 203 is fixed on the chassis in advance with a screw, as shown by the assembled state in FIG. 25, when disposing the cable 5 on the chassis, the cable 5 is inserted through the noise absorbing unit 103, and thereafter the noise absorbing unit 103 is fixed on the fixing base 203. Since the noise absorbing unit 103 can be fixed on the chassis with a single operation, the fixing operation can be facilitated very much. At this time, when the noise absorbing unit 103 is vertically placed on the fixing base 203 from above, as shown by the longitudinal sectional view in FIG. 26, the cylindrical outer circumferential surface of the noise absorbing unit 103 is supported by the support wall portion 92 stably in the circumferential direction. In this support state, the lower end portions of the guides 37 formed on the noise absorbing unit 103 enter the recessed guide portions 97, the fit-in piece 94 of the fixing base 203 is fitted in the corresponding fitting groove 38, and the fitting projecting portion 36 formed on the noise absorbing unit 103 is fitted in the fitting hole 96 by utilizing elastic deformation of the fitting piece 95.

Accordingly, in this state, since the fit-in piece 94 has a predetermined width and is tightly fitted in the corresponding fitting groove 38 in the direction of thickness, the noise absorbing unit 103 is prohibited from moving in the axial and circumferential directions, and can be positioned with respect to the fixing base 203 in the planar direction. Thus, when the fitting projecting portion 36 is fitted with the fitting piece 95 to fix the noise absorbing unit 103 on the fixing base 203, the noise absorbing unit 103 is prevented from moving in the axial direction to disengage the fitting projecting portion 36 and the fitting piece 95 from each other. Since the elastic support piece 93 of the fixing base 203 is elastically deformed downward by the circumferential surface of the noise absorbing unit 103, it applies an upward force to the noise absorbing unit 103 with the reaction force of the elastic force. By this upward force, the fitting projecting portion 36 is strongly pressed against the inner upper surface of the fitting piece 95, so that it is prevented from removal from the fitting hole 96. Therefore, vertical backlash between the noise absorbing unit 103 and the fixing base 203 is absorbed, and the noise absorbing unit 103 is stably and firmly fixed and supported.

To remove the noise absorbing unit 103 from the fixing base 203, when the fitting piece 95 is elastically deformed outward to disengage the fitting projecting portion 36 and the fitting hole 96 from each other, the noise absorbing unit 103 can be lifted vertically upward. Then, the fitting grooves 38 disengage from the fit-in pieces 94, so that the noise absorbing unit 103 can be removed from the fixing base 203. Also, only the cable 5 can be removed from the noise absorbing unit 103 by disengaging the covers 2A and 2B from each other while the noise absorbing unit 103 stays fixed on the fixing base 203.

Each of the first to third embodiments exemplifies so-called toroidal ferrite members in which the covers of the noise absorbing unit form a short cylindrical shape. However, the present invention can similarly be applied to a noise absorbing apparatus constituted by ferrite members having a large axial length. The fixing base can be fixed on the chassis with a double-coated tape.

In the second and third embodiments, a band support arm may not be provided, in the same manner as in the first embodiment. Inversely, a band support arm and a mounting structure therefor as in the second embodiment can be adopted in the first and fourth embodiments.

As has been described above, the noise absorbing apparatus according to the present invention comprises a noise absorbing unit constituted by a pair of ferrite members and a pair of covers covering the ferrite members, and a fixing base which is fixed on a chassis where a cable extends and which fits on the noise absorbing unit, thereby fixing the noise absorbing unit on the chassis. If the fixing base is fixed at the required portion of the chassis in advance, when the cable is applied, the noise absorbing unit can be fixed on the fixing base simultaneously only by fitting the noise absorbing unit on the fixing base. Therefore, the noise absorbing unit can be fixed on the chassis with a single operation. This fixing operation or a removing operation can be facilitated very much. In particular, even at a narrow portion in an electronic equipment, the noise absorbing apparatus can be disposed quickly and easily.

According to the present invention, a band support arm that can be mounted on and detached from the noise absorbing unit is provided. The cable inserted through the noise absorbing unit can be fastened with a fastening band extending through the band support arm, thereby integrally supporting the cable on the noise absorbing unit. When the noise absorbing unit is fixed and supported by using a fixing base fixed on the chassis, the cable can also be fixed and supported on the chassis, and the cable can be arranged stably.

According to the present invention, locking pieces for supporting the ferrite members within the covers are molded by utilizing the fitting grooves formed in the covers as mold release holes. The fitting pieces of the fixing base are inserted and fixed in position by utilizing these fitting grooves, so that the noise absorbing unit is stably supported on the fixing base. The arrangement of the fitting portions formed respectively on the noise absorbing unit and the fixing base can be simplified. Therefore, the structure of a mold used for molding the covers with a resin can be simplified, and a decrease in cost can be realized.

What is claimed is:

1. A noise absorbing apparatus comprising:

a noise absorbing unit constituted by a pair of ferrite members and a pair of covers covering said ferrite members, said ferrite members being positioned to oppose each other and to be in tight contact with each other in order to sandwich a cable;

a fixing base which is fixed on a chassis where said cable extends and which fits on said noise absorbing unit, thereby fixing the noise absorbing unit on said chassis;

said covers of said noise absorbing unit being formed cylindrically;

fitting projections formed on two end faces of each of said covers; and a pair of fitting pieces to fit with said fitting projections of said covers extending upright on said fixing base.

2. An apparatus according to claim 1, wherein said fitting pieces are elastically deformable in an axial direction of said noise absorbing unit, and are fitted on said fitting projections of said covers with an elastic force thereof.

3. An apparatus according to claim 1, wherein said covers of said noise absorbing unit are formed cylindrically, fitting grooves substantially directed in a radical direction and a latching projection projecting in the axial direction are integrally formed on one of the end faces of each of said covers, and fit-in pieces to fit in said fitting grooves and a keeper piece having a keeper hole to receive said latching projection, said keeper piece extends upright on said fixing base.

4. An apparatus according to claim 3, wherein a notched portion is formed in one of said covers of said noise absorbing unit, a band support arm is arranged to be clamped between said notched portion and the other cover, and said cable extending through said noise absorbing unit is integrally fastened on said noise absorbing unit with a fastening band inserted in said band support arm.

* * * * *